(12) United States Patent
Tsutsue et al.

(10) Patent No.: US 7,994,589 B2
(45) Date of Patent: *Aug. 9, 2011

(54) SEMICONDUCTOR DEVICE AND METHOD FOR FABRICATING THE SAME

(75) Inventors: Makoto Tsutsue, Shiga (JP); Masaki Utsumi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/858,942

(22) Filed: Aug. 18, 2010

(65) Prior Publication Data

US 2010/0308464 A1 Dec. 9, 2010

Related U.S. Application Data

(62) Division of application No. 12/264,675, filed on Nov. 4, 2008, which is a division of application No. 10/983,760, filed on Nov. 9, 2004, now Pat. No. 7,453,128.

(30) Foreign Application Priority Data

Nov. 10, 2003 (JP) ................. 2003-379754

(51) Int. Cl.
*H01L 29/76* (2006.01)
(52) U.S. Cl. . 257/409; 257/484; 257/620; 257/E29.013; 257/E23.002
(58) Field of Classification Search .......... 257/409, 257/484, 620, E29.013, E23.002
See application file for complete search history.

(56) References Cited

U.S. PATENT DOCUMENTS

| 5,652,459 | A | 7/1997 | Chen |
| 5,889,314 | A | 3/1999 | Hirabayashi |
| 5,900,763 | A | 5/1999 | Rahim et al. |
| 6,022,791 | A | 2/2000 | Cook et al. |
| 6,163,065 | A | 12/2000 | Seshan et al. |
| 6,261,945 | B1 | 7/2001 | Nye, III et al. |
| 6,424,051 | B1 | 7/2002 | Shinogi et al. |
| 6,498,089 | B2 | 12/2002 | Komada |
| 6,509,622 | B1 | 1/2003 | Ma et al. |
| 6,552,433 | B1 | 4/2003 | Chou et al. |

(Continued)

FOREIGN PATENT DOCUMENTS

CN 1407620 A 4/2003

(Continued)

OTHER PUBLICATIONS

Chinese Office Action (and English translation) issued in Chinese Patent Application No. CN 200410088940.7, dated Feb. 15, 2008.

(Continued)

*Primary Examiner* — Tu-Tu V Ho
(74) *Attorney, Agent, or Firm* — McDermott Will & Emery LLP

(57) ABSTRACT

A seal ring structure is formed through a multilayer structure of a plurality of dielectric films in a peripheral part of a chip region to surround the chip region. A dual damascene interconnect in which an interconnect and a plug connected to the interconnect are integrated is formed in at least one of the dielectric films in the chip region. Part of the seal ring structure formed in the dielectric film in which the dual damascene interconnect is formed is continuous. A protection film formed on the multilayer structure has an opening on the seal ring. A cap layer connected to the seal ring is formed in the opening.

9 Claims, 19 Drawing Sheets

U.S. PATENT DOCUMENTS

| | | | |
|---|---|---|---|
| 6,559,548 | B1 | 5/2003 | Matsunaga et al. |
| 6,870,265 | B2 | 3/2005 | Kurimoto et al. |
| 7,453,128 | B2 | 11/2008 | Tsutsue et al. |
| 2002/0167071 | A1 | 11/2002 | Wang |
| 2003/0020098 | A1 | 1/2003 | Sasaki |
| 2003/0122220 | A1 | 7/2003 | West et al. |
| 2003/0137050 | A1 | 7/2003 | Chambers et al. |
| 2003/0160261 | A1 | 8/2003 | Moriya |
| 2003/0170934 | A1* | 9/2003 | Lin .............................. 438/118 |
| 2003/0218254 | A1 | 11/2003 | Kurimoto et al. |
| 2004/0026785 | A1 | 2/2004 | Tomita |
| 2004/0099877 | A1 | 5/2004 | Towle et al. |
| 2004/0150070 | A1 | 8/2004 | Okada et al. |
| 2004/0188843 | A1* | 9/2004 | Wakayama et al. ........... 257/758 |

FOREIGN PATENT DOCUMENTS

| | | |
|---|---|---|
| JP | 3-227539 A | 10/1991 |
| JP | 4-179246 A | 6/1992 |
| JP | 6-181233 A | 6/1994 |
| JP | 08-037289 | 2/1996 |
| JP | 10-98014 | 4/1998 |
| JP | 2000-232104 | 8/2000 |
| JP | 2000-277465 | 10/2000 |
| JP | 2000-340569 A | 12/2000 |
| JP | 2001-23937 | 1/2001 |
| JP | 2001-267325 A | 9/2001 |
| JP | 2002-134506 | 5/2002 |
| JP | 2002-270608 A | 9/2002 |
| JP | 2002-289689 A | 10/2002 |
| JP | 2002-353307 A | 12/2002 |
| JP | 2003-86590 | 3/2003 |
| JP | 2004-296843 | 10/2004 |
| JP | 3962402 | 5/2007 |

OTHER PUBLICATIONS

Japanese Notice of Reasons for Rejection, w/ English translation thereof, issued in Japanese Patent Application No. JP 2007-043571 dated Jul. 21, 2009.

Defendant's Preliminary Statement, w/ partial English translation, pp. 10-67, Aug. 31, 2010.

The Third Brief, w/ partial English translation, pp. 2-31, Oct. 12, 2010.

The Comments on the Defendant's Preliminary Statement (English translation only).

"Altera Continues 0.13-micron Success as Cyclone Devices Move to Production in Record Time," ALTERA, accessed Aug. 26, 2010, 2 pages.

"Focused Technology Analysis on the Altera Cyclone EP1C6Q240C6 FPGA," Altera, Report #29614, Aug. 2010, 21 pages.

"Altera Completes First Generation Cyclone Device Family Rollout," ALTERA, accessed Aug. 26, 2010, 2 pages.

"Customer Advisory ADV0201: Non-BGA Package Top Mark Enhancement," Altera Corporation, Feb. 4, 2002.

"Cyclone FPGA Family," ES-CYCFPGA-1.3, Altera Corporation, Jan. 2007.

United States of Notice of Allowance issued in U.S. Appl. No. 12/264,675, mailed Jan. 28, 2011.

Japanese Notice of Reasons for Rejection, w/ English translation thereof, issued in Japanese Patent Application No. JP 2007-043571 dated Aug. 3, 2010.

* cited by examiner

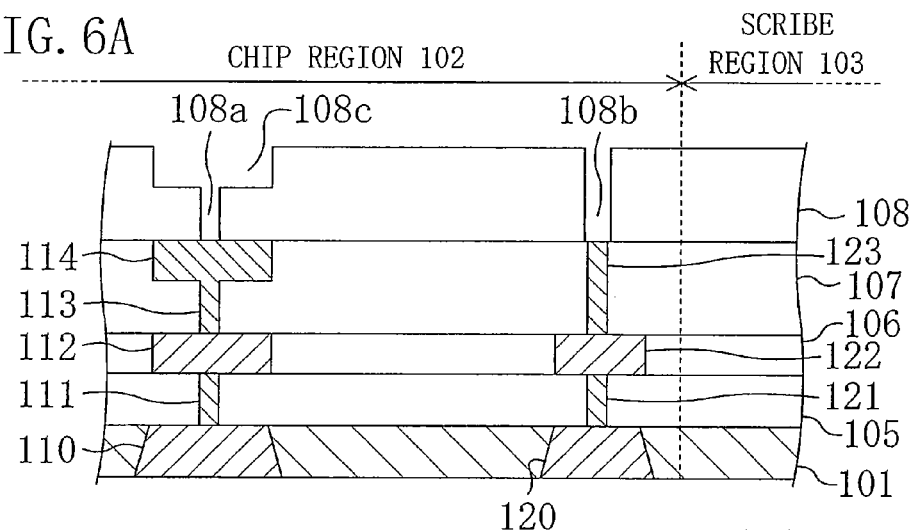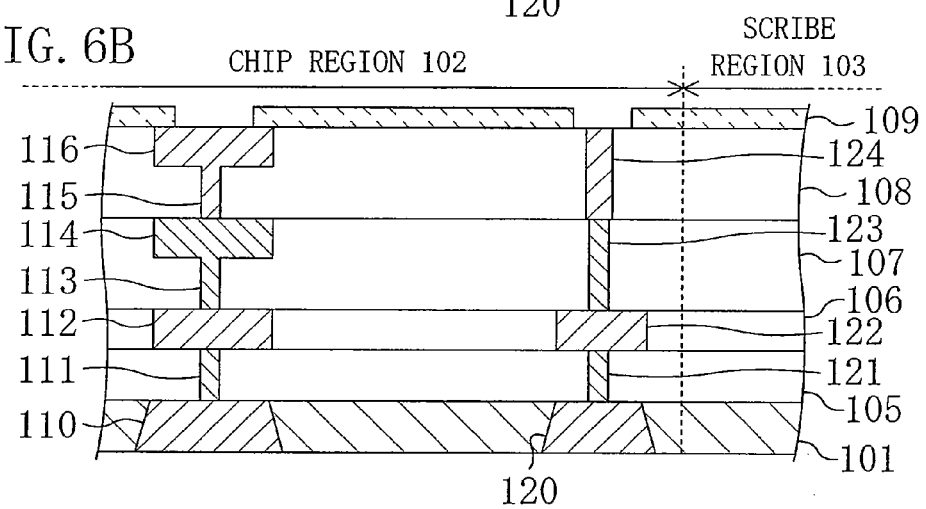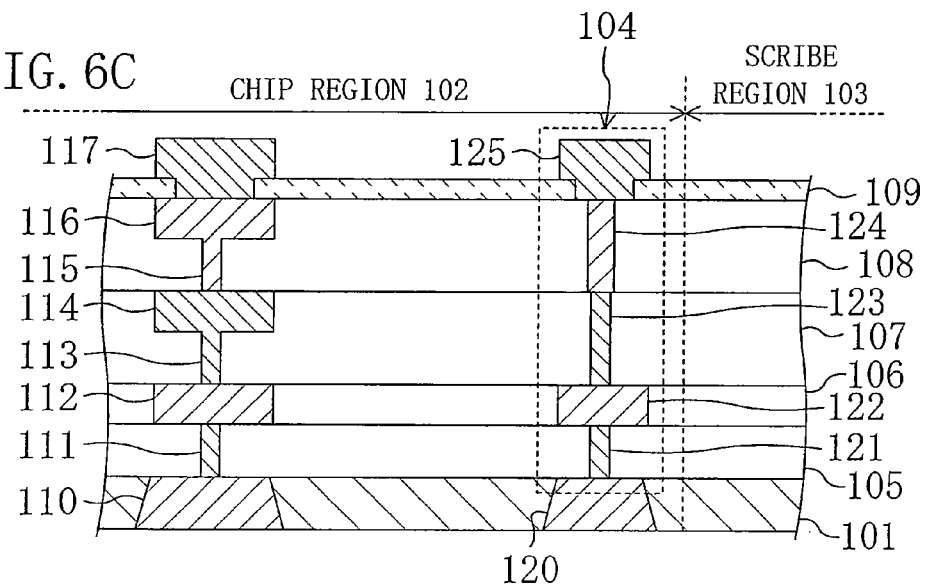

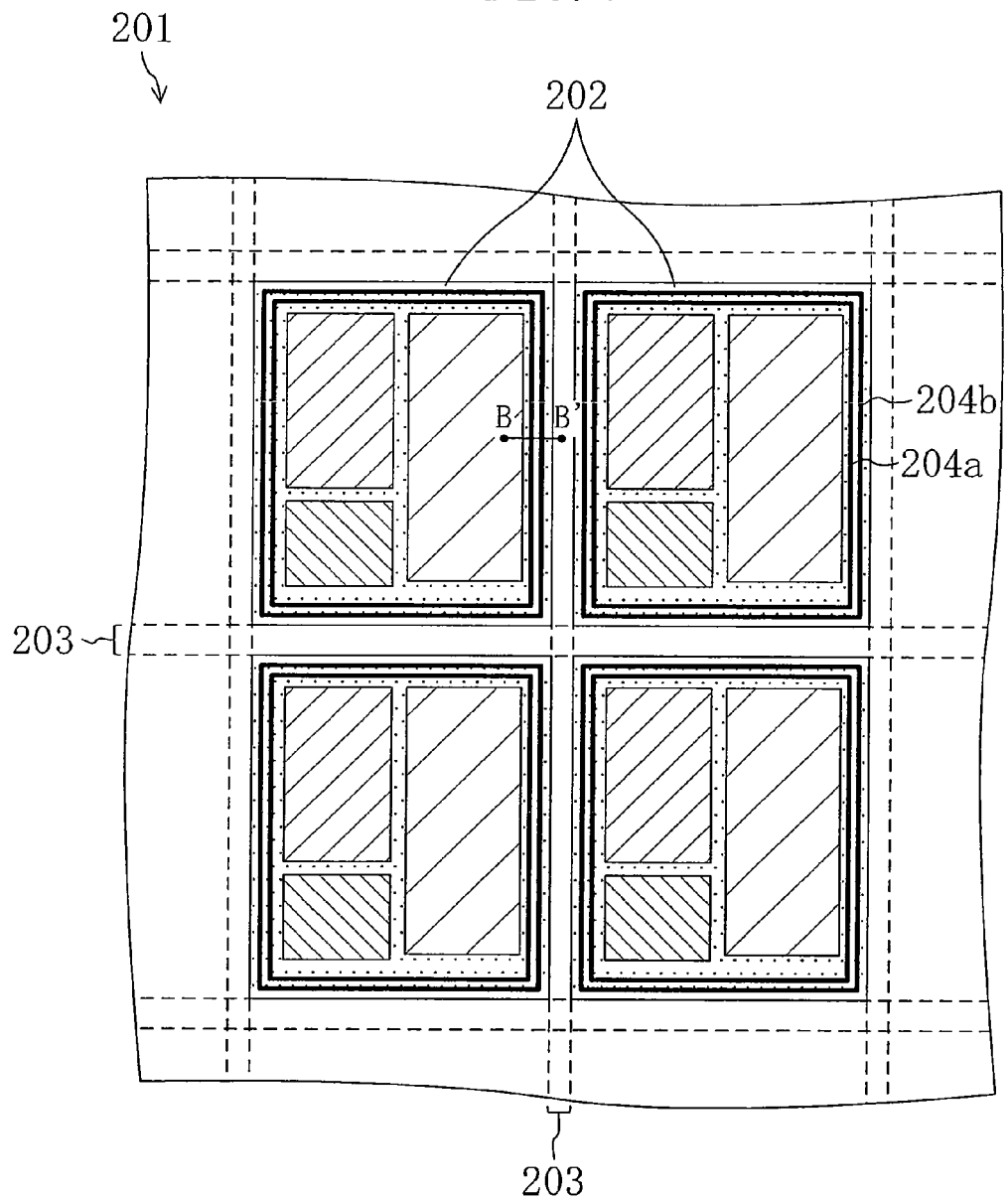

SEMICONDUCTOR DEVICE AND METHOD FOR FABRICATING THE SAME

CROSS-REFERENCE TO RELATED APPLICATION

This application is a Divisional of U.S. patent application Ser. No. 12/264,675, filed on Nov. 4, 2008, which is a Divisional of U.S. patent application Ser. No. 10/983,760, filed on Nov. 9, 2004, now U.S. Pat. No. 7,453,128, claiming priority of Japanese Patent Application No. 2003-379754, filed on Nov. 10, 2003, the entire contents of each of which are hereby incorporated by reference.

BACKGROUND OF THE INVENTION

The present invention relates to a semiconductor device having a seal ring structure surrounding a chip region and to a method for fabricating the device.

A semiconductor device is generally fabricated by arranging a large number of integrated circuits (ICs) constituted by a plurality of elements and provided with given functions on a semiconductor wafer of, for example, silicon.

A large number of chip regions arranged on a wafer are separated from each other by a scribe region (scribe line) having a lattice pattern. After the large number of chip regions have been formed on a wafer through a semiconductor fabrication process, the wafer is diced into chips along the scribe region, thereby forming semiconductor devices.

However, when the wafer is diced into chips, chip regions near the scribe line might suffer mechanical damage, resulting in occurrence of cracks or chipping in part of the diced cross sections of the separated chips, i.e., semiconductor devices.

To solve this problem, in Japanese Unexamined Patent Publication (Kokai) No. 2001-23937 (hereinafter, referred to as reference 1), proposed is a technique for preventing crack propagation in chip regions during dicing by providing a seal ring serving as a ring-shaped protection wall around the chip regions.

FIG. 19 is a cross-sectional view showing a conventional semiconductor device (formed in a wafer) having a seal ring.

As shown in FIG. 19, a chip region 2 is defined in a substrate 1 of a wafer by a scribe region 3. A multilayer structure made of a plurality of interlayer dielectric films 5 through 10 is formed on the substrate 1. An active layer 20 constituting an element is formed in the substrate 1 in the chip region 2. A plug (via) 21 is formed through the interlayer dielectric film 5 to be connected to the active layer 20. An interconnect 22 is formed through the interlayer dielectric film 6 to be connected to the plug 21. A plug 23 is formed through the interlayer dielectric film 7 to be connected to the interconnect 22. An interconnect 24 is formed through the interlayer dielectric film 8 to be connected to the plug 23. A plug 25 is formed through the interlayer dielectric film 9 to be connected to the interconnect 24. An interconnect 26 is formed through the interlayer dielectric film 10 to be connected to the plug 25.

As shown in FIG. 19, in part of the multilayer structure of the interlayer dielectric films 5 through 10 located in a peripheral part of the chip region 2, a seal ring 4 is formed through the multilayer structure to completely surround the chip region 2. As shown in reference 1, for example, the seal ring 4 is formed by alternately using masks for forming interconnects and masks for forming vias. Specifically, the seal ring 4 includes: a conductive layer 30 formed in the substrate 1; a seal via 31 formed through the interlayer dielectric film 5 to be connected to the conductive layer 30; a seal interconnect 32 formed through the interlayer dielectric film 6 to be connected to the seal via 31; a seal via 33 formed through the interlayer dielectric film 7 to be connected to the seal interconnect 32; a seal interconnect 34 formed through the interlayer dielectric film 8 to be connected to the seal via 33; a seal via 35 formed through the interlayer dielectric film 9 to be connected to the seal interconnect 34; and a seal interconnect 36 formed through the interlayer dielectric film 10 to be connected to the seal via 35. Parts of the seal ring formed by using masks for forming interconnects will be hereinafter referred to as seal interconnects, and parts of the seal ring formed by using masks for forming vias will be hereinafter referred to as seal vias.

As shown in FIG. 19, a passivation film 11 is formed on the multilayer structure of the interlayer dielectric films 5 through 10 in which interconnects (22, 24, 26), vias (21, 23, 25) and the seal ring 4 are provided. The passivation film 11 has an opening on the interconnect 26, and a pad 27 connected to the interconnect 26 is formed in the opening.

SUMMARY OF THE INVENTION

However, the conventional semiconductor device has the problem that the passivation film peels off by impact caused during dicing of a wafer or the problem that the impact propagates through the passivation film to reach the inside of the chip region.

If the passivation film has an opening on the seal ring and the upper part of the seal ring is exposed in the opening as in the semiconductor device disclosed in reference 1, it is impossible to sufficiently prevent moisture or the like from entering a region surrounded by the seal ring from the outside.

To prevent increase in capacitance between interconnects involved in miniaturization of semiconductor elements and of interconnects connected thereto, i.e., to prevent decrease in processing speed of semiconductor devices, a technique for preventing the increase in capacitance between interconnects by using interlayer dielectric films with low dielectric constants (low-κ interlayer dielectric films) has been developed.

However, the low-κ interlayer dielectric films generally have low mechanical strength, so that the low-κ interlayer dielectric films exhibit insufficient durability against stress occurring during dicing, as compared to interlayer dielectric films made of conventional materials. Therefore, the low-κ interlayer dielectric films are susceptible to damage during dicing. Accordingly, even if a seal ring is formed by alternately using masks for vias and masks for interconnects in a peripheral part of a chip region in a semiconductor device using such low-κ interlayer dielectric films as in the conventional device, damage during dicing is not sufficiently prevented. Specifically, the conventional seal ring formed by alternately using masks for vias and masks for interconnects includes a large number of components, so that the seal ring has a large number of junctions between components (e.g., a junction between a seal via and a seal interconnect). As the number of junctions between components increases, the number of portions where components are not connected is likely to increase. As a result, such junctions (or portions where components are not connected) act as paths through which impact propagates, so that it is impossible to prevent cracks or the like occurring during dicing from propagating into chip regions.

It is therefore an object of the present invention to prevent degradation of moisture resistance and reliability of a semiconductor device by preventing propagation of chipping, cracks and the like caused during dicing, which is performed to divide a wafer into chips, from a side of a chip (semiconductor device) into a chip region.

In order to obtain the object, a semiconductor device according to the present invention includes: an element formed on a substrate in a chip region; a multilayer structure including a plurality of interlayer dielectric films formed on the substrate; an interconnect formed in at least one of the interlayer dielectric films in the chip region; a plug formed in at least one of the interlayer dielectric films in the chip region and connecting either the element and the interconnect or the interconnect and another interconnect; a seal ring structure formed through the multilayer structure in a peripheral part of the chip region and surrounding the chip region (without interruption); and a protection film formed on the multilayer structure in which the interconnect, the plug and the seal ring structure are provided. In this device, a dual damascene interconnect in which the interconnect and the plug connected to the interconnect are integrated is formed in at least one of the interlayer dielectric films in the chip region, part of the seal ring structure located in the interlayer dielectric film in which the dual damascene interconnect is formed is continuous, and the protection film has an opening on the seal ring structure, and a cap layer connected to the seal ring structure is formed in the opening.

In the semiconductor device of the present invention, the protection film such as a passivation film has an opening on the seal ring structure. In other words, the protection film is partially discontinuous in a peripheral part of the chip region. Accordingly, it is possible to prevent peeling of the protection film in the chip region caused by impact on a wafer during dicing. It is also possible to prevent impact on the protection film outside the chip region from propagating through the protection film and reaching the inside of the chip region.

In addition, at least part of the seal ring structure is continuous in the interlayer dielectric film in which the dual damascene structure is provided. In other words, this part of the seal ring structure has no "junction." Accordingly, the number of "junctions" between components in the entire seal ring structure is reduced. As a result, it is possible to prevent cracks or the like occurring during dicing from propagating into the chip region through "junctions." It is also possible to prevent an impurity or the like from entering the chip region from the outside of the seal ring structure.

Moreover, the cap layer (e.g., a cap layer made of a conductor) is buried in the opening of the protection film formed on the seal ring structure such that this cap layer and the body of the seal ring structure are continuous. Accordingly, unlike a case where no cap layer is provided, it is possible to prevent moisture or an impurity which has entered from the scribe region during dicing from entering the chip region via the peripheral part of the chip region, i.e., the opening of the protection film near the scribe region.

In the device of the present invention, at least part of the seal ring structure is preferably buried in a concave portion formed in one of the interlayer dielectric films or in at least two successive interlayer dielectric films out of the plurality of interlayer dielectric films, and the concave portion preferably has an aspect ratio of three or more.

This ensures reduction of the number of "junctions" between components in the entire seal ring structure.

In the device of the present invention, the seal ring structure is preferably divided into at least two branches in at least one of the interlayer dielectric films.

Then, a structure in which components of the seal ring structure are connected to each other via two or more branches (which are also components of the seal ring structure) is implemented. Specifically, the chip region is surrounded by this partial structure including two (or three or more) seal ring branches in a film. In this film, the seal ring structure is composed of a plurality of branches, so that the seal ring structure has high mechanical strength. Accordingly, even if an interlayer dielectric film in the scribe region is damaged by stress occurring during dicing, the seal ring structure serves as a protection wall and prevents propagation of the damage to the interlayer dielectric film in the scribe region toward the chip region or prevents propagation of impact during dicing through the interlayer dielectric film in the chip region.

In the device of the present invention, the seal ring structure preferably includes at least two seal rings surrounding the chip region.

Then, a first seal ring (inner seal ring) which surrounds the chip region and at least one seal ring (outer seal ring) which surrounds the first seal ring and is electrically insulated from the first seal ring are formed between the chip region and the scribe region surrounding the chip region. With this structure, even if a seal ring located outside the first seal ring is damaged, e.g., suffered from breaking or cracks, by the stress from a dicing blade during dicing, the first seal ring prevents impact from propagating into the chip region. Even if the seal ring outside the first seal ring is damaged, the first seal ring prevents moisture or a contaminant from entering the chip region because the first seal ring is formed independently of this outer seal ring.

If the chip region is surrounded by at least two seal rings, the opening of the protection film may be located only on an outermost seal ring out of the seal rings, and the cap layer may be formed in the opening to be connected to the outermost seal ring. Alternatively, each of the seal rings may be divided into at least two branches in at least one of the interlayer dielectric films.

In the device of the present invention, a plurality of projections are preferably provided on a side of the seal ring structure.

Then, it is possible to prevent impact and stress caused by contact of a dicing blade with a film such as a protection film during dicing of a wafer and cracks and the like occurring in the wafer resulting from the impact and stress, from propagating along the side (the side facing the scribe region) of the seal ring structure.

In the device of the present invention, the seal ring structure preferably has a waved-shaped periphery when viewed from above the substrate.

Then, it is possible to prevent impact and stress caused by contact of a dicing blade with a film such as a protection film during dicing of a wafer and cracks and the like occurring in the wafer resulting from the impact and stress, from propagating along the side of the seal ring structure.

In the device of the present invention, the seal ring structure may include at least one material selected from the group consisting of W, Al and Cu.

In the semiconductor device of the present invention, if the cap layer includes Al, prevention of erosion of the seal ring structure (especially a seal ring structure made of Cu) is ensured.

A method for fabricating a semiconductor device according to the present invention is a method for fabricating a semiconductor device including: an element formed on a substrate in a chip region; a multilayer structure including a plurality of interlayer dielectric films formed on the substrate; an interconnect formed in at least one of the interlayer dielectric films in the chip region; a plug formed in at least one of the interlayer dielectric films in the chip region and connecting either the element and the interconnect or the interconnect and another interconnect; and a seal ring structure formed through the multilayer structure in a peripheral part of the chip region and surrounding the chip region. Specifically, the method includes the steps of: forming, through one of the interlayer dielectric films, a first concave portion in which the plug is to be buried and a second concave portion in which part of the seal ring structure is to be buried; forming a third concave portion in which the interconnect is to be buried in an upper part of said one of the interlayer dielectric films such that the third concave portion is connected to the first concave portion; burying a conductive film in the first, second and third concave portions, thereby forming a dual damascene interconnect in which the plug and the interconnect are integrated and said part of the seal ring structure; forming a protection film on the multilayer structure in which the interconnect, the plug and the seal ring structure are provided; and forming an opening in part of the protection film on the seal ring structure and forming a cap layer in the opening such that the cap layer is connected to the seal ring structure.

That is, the method for fabricating a semiconductor device according to the present invention is a method for fabricating the above-described semiconductor device. Therefore, the same advantages are obtained.

In the method of the present invention, if the aspect ratio of the second concave portion is three or more, reduction of the number of "junctions" between components in the entire seal ring structure is ensured.

The method of the present invention may further include the step of forming a fourth concave portion in which another part of the seal ring structure is to be buried in another interlayer dielectric film stacked on said one of the interlayer dielectric films such that the fourth concave portion is connected to the second concave portion.

As described above, according to the present invention, in a semiconductor device including a chip region and a seal ring structure provided in a peripheral part of the chip region and surrounding an element, interconnect layers and others in the chip region, a seal ring structure including a small number of "junctions" between its components is provided, a protection film has an opening on the seal ring structure, and a cap layer is formed in the opening. This seal ring structure may partially include branches (e.g., at least two conductors serving as bridges in part of the seal ring structure) or may include two or more seal rings surrounding the chip region (e.g., a first seal ring formed in a peripheral part of the chip region and at least one seal ring surrounding the first seal ring.)

With the foregoing features of the present invention, it is possible to prevent chipping, breaking and the like caused by dicing a wafer into chips (semiconductor devices) from reaching chip regions. Accordingly, it is also possible to prevent degradation of the moisture resistance and reliability of the semiconductor devices.

BRIEF DESCRIPTION OF THE DRAWINGS

FIGS. 6A through 6C are cross-sectional views showing respective process steps of the method for fabricating the semiconductor device of the first embodiment.

FIG. 7 is a plan view showing part of a wafer on which a semiconductor device according to a second embodiment of the present invention is provided.

DESCRIPTION OF THE PREFERRED EMBODIMENTS

Hereinafter, embodiments of the present invention will be described with reference to the drawings.

A first feature of the present invention is that a seal ring and an interconnect structure are formed by the same process and a dual damascene process is adopted to form the seal ring.

Accordingly, the resultant seal ring includes a small number of "junctions" between its components, as compared to the case of adopting a single damascene process. In this description, a structure in which an interconnect and a plug (for connecting interconnects or an interconnect and an element) are stacked is referred to as an interconnect structure.

A second feature of the present invention is that an opening is formed in part of a passivation film (e.g., a SiN film) covering the top of the seal ring and a cap is provided in the opening. This prevents impact on the passivation film during dicing from propagating into a chip region (see first embodiment.)

A third feature of the present invention is that the seal ring is partially divided into two or more branches and these branches serve as an integrated unit. This enhances the mechanical strength of the seal ring itself, thereby preventing impact from a scribe line during dicing from propagating into a chip region.

A fourth feature of the present invention is that at least two seal rings surround a chip region. Accordingly, the seal ring structure is stronger than a seal ring structure in which a single seal ring surrounds the chip region (see second embodiment.)

The other embodiments of the present invention will be specifically described in the following description.

Embodiment 1

Hereinafter, a semiconductor device and a method for fabricating the device according to a first embodiment of the present invention will be described with reference to drawings.

Figure 1:
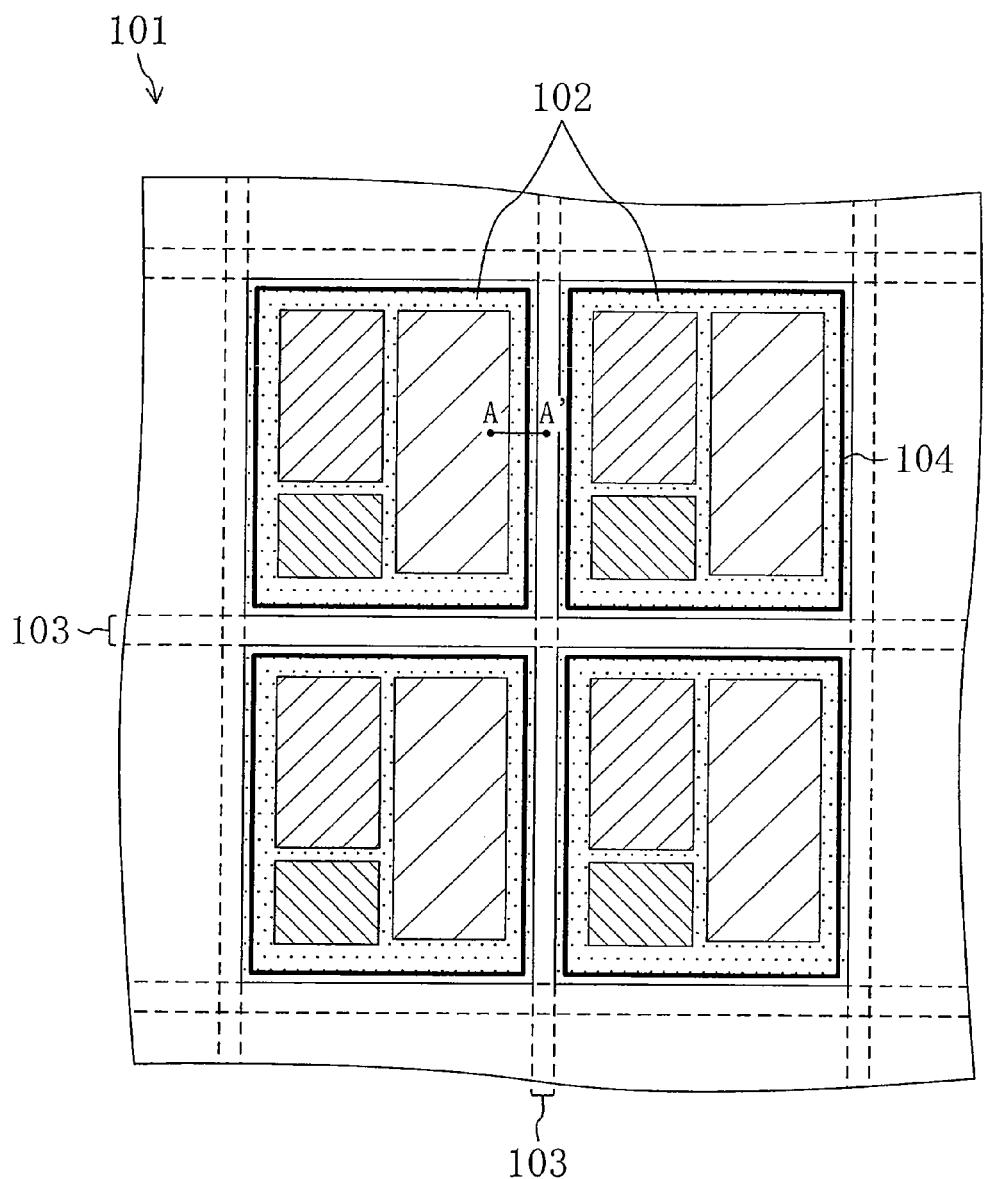
FIG. 1 is a plan view showing part of a wafer on which a semiconductor device according to a first embodiment of the present invention is provided.

FIG. 1 is a plan view showing part of a wafer on which the semiconductor device of the first embodiment (i.e., a semiconductor device in which one seal ring surrounds a chip region) is provided.

As shown in FIG. 1, on a wafer 101 to be a semiconductor substrate, which is typically a silicon substrate, for example, a plurality of chip regions 102 to be semiconductor devices are provided. In each of the chip regions 102, an integrated circuit (IC) made of a plurality of elements and provided with a given function is formed. The chip regions 102 are defined by a scribe region 103 having a lattice pattern.

A semiconductor device (i.e., a semiconductor chip) includes: a chip region 102 on which an IC made of a plurality of elements and provided with a given function is formed; and a seal ring 104 provided in a peripheral part of the chip region 102 to surround the chip region 102. The wafer 101 on which a plurality of such semiconductor devices are formed is diced along the scribe region 103, thereby separating the semiconductor devices.

Figure 2A:
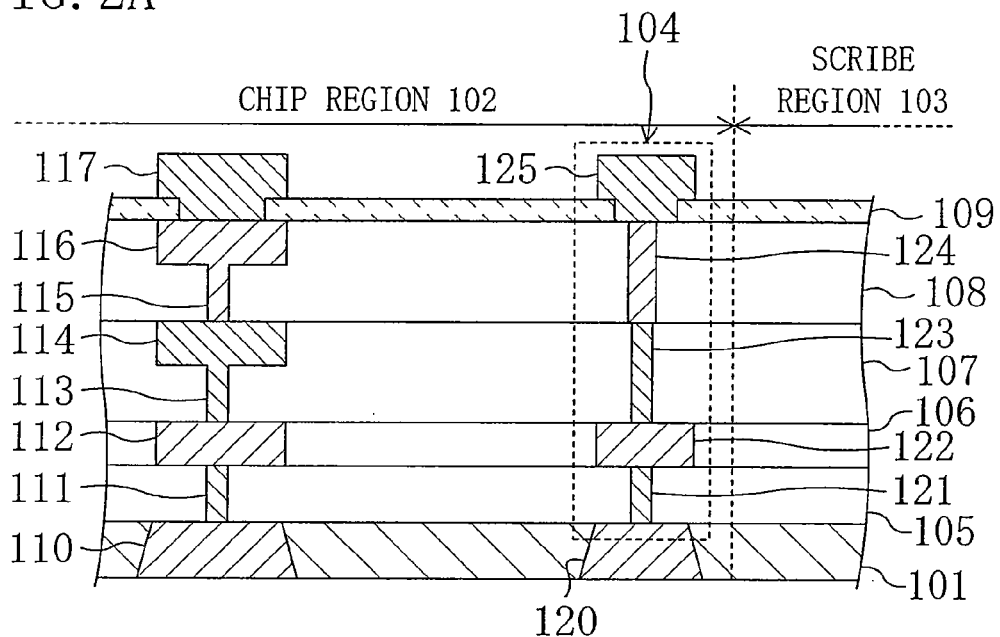
FIGS. 2A and 2B are views respectively showing variations of the cross-sectional structure taken along the line A-A' in FIG. 1 (i.e., cross-sectional structure of an end of a semiconductor device including a seal ring portion located in a peripheral part of a chip region.)
Figure 2B:
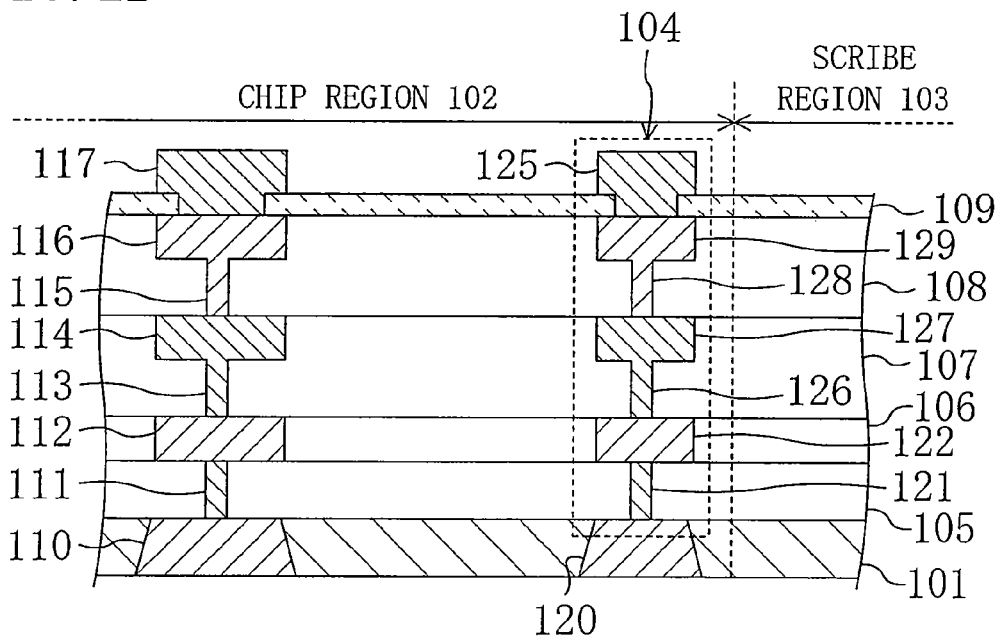
Figure 3A:
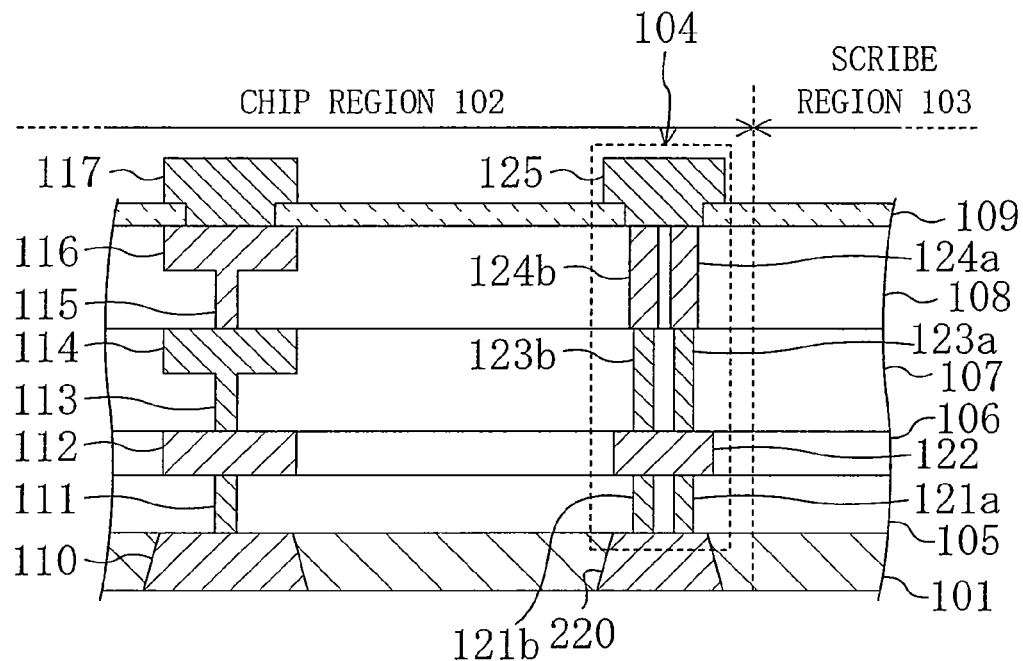
FIG. 3A is a view showing a variation of the cross-sectional structure taken along the line A-A' in FIG. 1 (i.e., a cross-sectional structure of an end of a semiconductor device including a seal ring portion located in a peripheral part of a chip region.) FIG. 3B schematically shows planar structures of a via and a seal via provided in a film where the via is formed in the structure shown in FIG. 2A or 2B.
Figure 3B:

FIGS. 2A, 2B and 3A show variations of the cross-sectional structure taken along the line A-A' in FIG. 1 (i.e., a cross-sectional structure of an end of a semiconductor device including a seal ring portion located in a peripheral part of the chip region 102.) FIG. 3B schematically shows planar structures of a via and a seal via which are provided in the same film in the structure shown in FIG. 2A or 2B.

FIGS. 2A, 2B and 3A show cross-sectional structures of interconnect structures and seal rings in the chip region 102.

As shown in FIGS. 1, 2A, 2B and 3A, a semiconductor device before dicing includes the chip regions 102 and the scribe region 103, and the seal ring 104 is formed in each of the chip regions 102 near the boundary between the chip region 102 and the scribe region 103.

Now, features of the respective structures shown in FIGS. 2A, 2B and 3A will be described specifically.

First, the structure shown in FIG. 2A has a feature in which seal vias constituting the seal ring 104 are continuously formed through at least two films.

Next, the structure shown in FIG. 2B has a feature in which seal vias and seal interconnects constituting the seal ring 104 are alternately provided.

Then, the structure shown in FIG. 3A has a feature in which a seal via constituting the seal ring 104 is divided into at least two branches in the same interlayer dielectric film.

On the other hand, the structures shown in FIGS. 2A, 2B and 3A have a common feature in which a seal ring cap (a cap layer 125) is provided at the top of the seal ring 104.

Hereinafter, a method for fabricating a semiconductor device having the structure shown in FIG. 2A will be described with reference to FIGS. 4A through 4D, 5A through 5C and 6A through 6C.

Figure 4A:
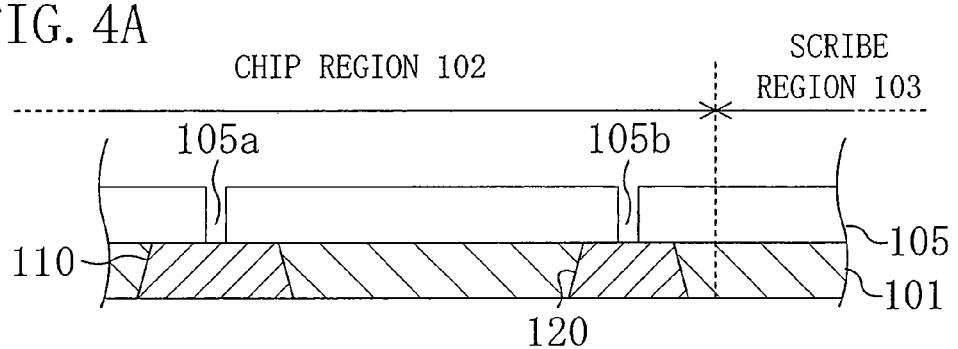
FIGS. 4A through 4D are cross-sectional views showing respective process steps of a method for fabricating a semiconductor device according to the first embodiment.

First, as shown in FIG. 4A, an active layer 110 constituting an element such as a transistor is formed in a wafer 101 (hereinafter, referred to as a substrate 101) in a chip region 102. At the same time, a conductive layer 120 configured in the same manner as the active layer 110 is formed in the substrate 101 in a peripheral part of the chip region 102 (i.e., in a region to be a seal ring, which will be hereinafter referred to as a seal ring region, near a scribe region 103.)

Then, a first interlayer dielectric film 105 is deposited on the substrate 101. Thereafter, through a lithography process and a dry etching process, a via hole 105a for forming a first via 111 (see FIG. 4B) is formed through the first interlayer dielectric film 105 in the chip region 102 and, at the same time, a trench concave portion 105b for forming a first seal via 121 (see FIG. 4B) is formed through the first interlayer dielectric film 105 in the seal ring region. The seal via is a component constituting a seal ring and is formed by filling the trench concave portion with a conductive material. That is, a seal via has a line structure having substantially the same width as that of a via in the chip region (see FIG. 3B.)

In this embodiment, the aspect ratio of the seal via (i.e., the ratio of the depth to the width in the concave portion in which the seal via is buried) is preferably one or more.

In this embodiment, the via hole 105a and the trench concave portion 105b for forming the first seal via 121 are formed at the same time in the first interlayer dielectric film 105 in the chip region 102. Alternatively, the via hole 105a and the trench concave portion 105b may of course be formed individually.

Figure 4B:
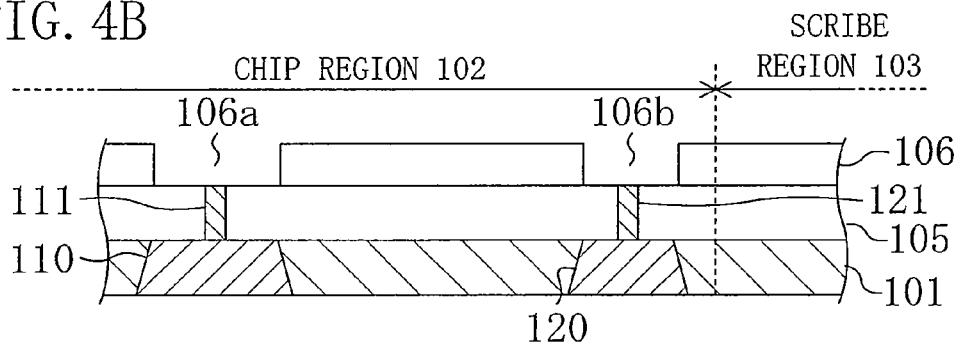

Next, as shown in FIG. 4B, the via hole 105a and the trench concave portion 105b formed through the first interlayer dielectric film 105 are filled with a conductive film made of, for example, W (tungsten) by, for example, a chemical vapor deposition (CVD) process. Then, an unnecessary part of the conductive film extending off the via hole 105a and the trench concave portion 105b is removed by, for example, a chemical/mechanical polishing (CMP) process, thereby forming a first via 111 connected to the active layer 110 and a first seal via 121 connected to the conductive layer 120.

Thereafter, a second interlayer dielectric film 106 is deposited on the first interlayer dielectric film 105. Then, through a lithography process and a dry etching process, an interconnect trench 106a for forming a first interconnect 112 (see FIG. 4C) is formed through the second interlayer dielectric film 106 in the chip region 102, and at the same time, an interconnect trench 106b for forming a first seal interconnect 122 (see FIG. 4C) is formed through the second interlayer dielectric film 106 in the seal ring region.

Figure 4C:
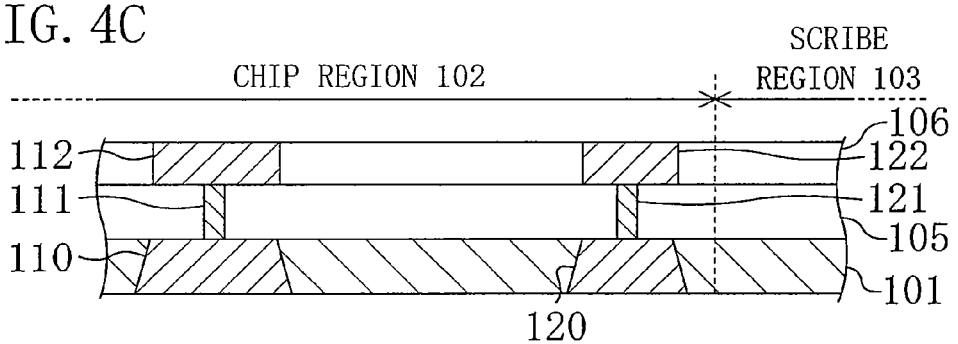

Then, as shown in FIG. 4C, the interconnect trenches 106a and 106b formed through the second interlayer dielectric film 106 are filled with a conductive film of, for example, Cu (copper) by, for example, an electroplating process. Then, part of the conductive film extending off the interconnect trenches 106a and 106b is removed by, for example, a CMP process, thereby forming a first interconnect 112 connected to the first via 111 and a first seal interconnect 122 connected to the first seal via 121.

Figure 4D:
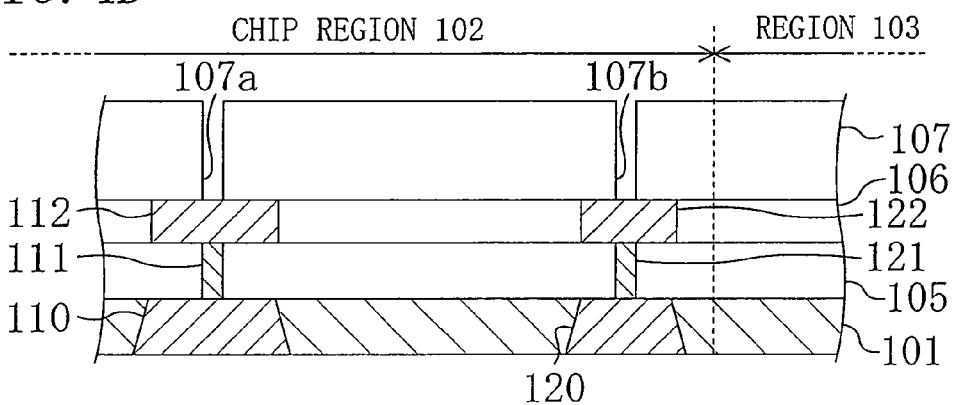

Thereafter, as shown in FIG. 4D, a third interlayer dielectric film 107 is deposited on the second interlayer dielectric film 106, and then a via hole 107a for forming a second via 113 (see FIG. 5C) is formed through the third interlayer dielectric film 107 in the chip region 102. At the same time, a trench concave portion 107b for forming a second seal via 123 (see FIG. 5C) is formed through the third interlayer dielectric film 107 in the seal ring region. In this embodiment, a premium is placed on efficiency, and the via hole 107a for forming the second via 113 to be a plug for connecting interconnects and the trench concave portion 107b for forming the second seal via 123 to be a part of the seal ring 104 are formed by the same process. Alternatively, the via hole 107a and the trench concave portion 107b may be formed by different processes.

Figure 5A:
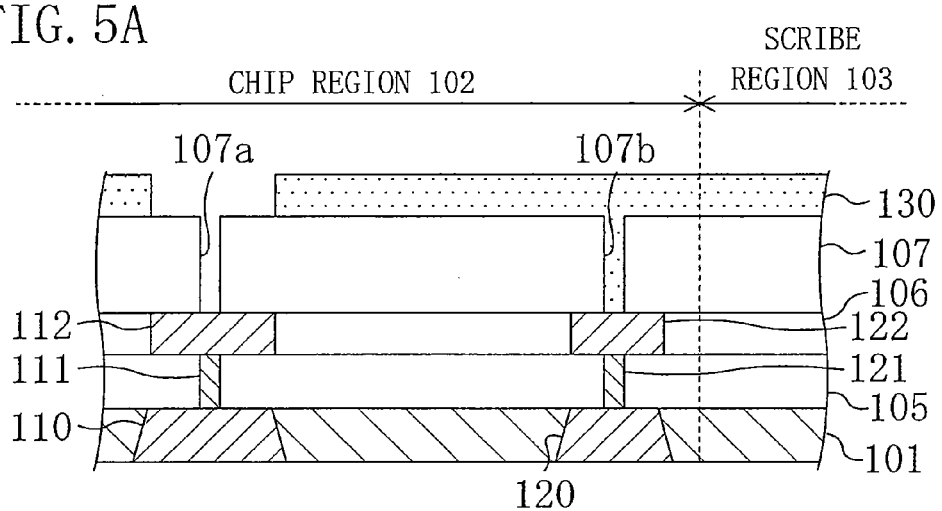
FIGS. 5A through 5C are cross-sectional views showing respective process steps of the method for fabricating the semiconductor device of the first embodiment.

Subsequently, as shown in FIG. 5A, a resist film 130 for forming an interconnect trench in which a second interconnect 114 (see FIG. 5C) is to be buried is formed on the third interlayer dielectric film 107 using a lithography process. This resist film 130 has an opening in a region where an interconnect is to be formed (hereinafter, referred to as an interconnect region) including the via hole 107a. The resist film 130 is also buried in the trench concave portion 107b.

Figure 5B:
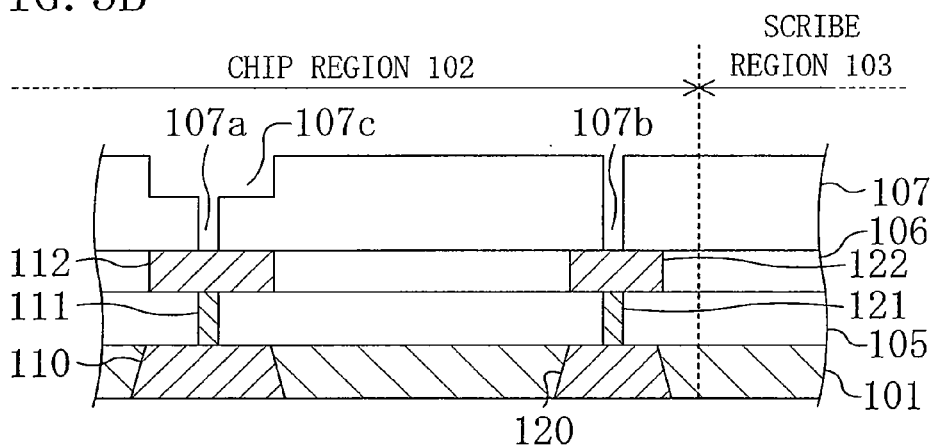

Then, as shown in FIG. 5B, through a dry etching process using the resist film 130 as a mask, an interconnect trench 107c for forming the second interconnect 114 is formed in an upper part of the third interlayer dielectric film 107 in the chip region 102 to be connected to the via hole 107a. Thereafter, the remaining resist film 130 is removed by ashing.

Figure 5C:
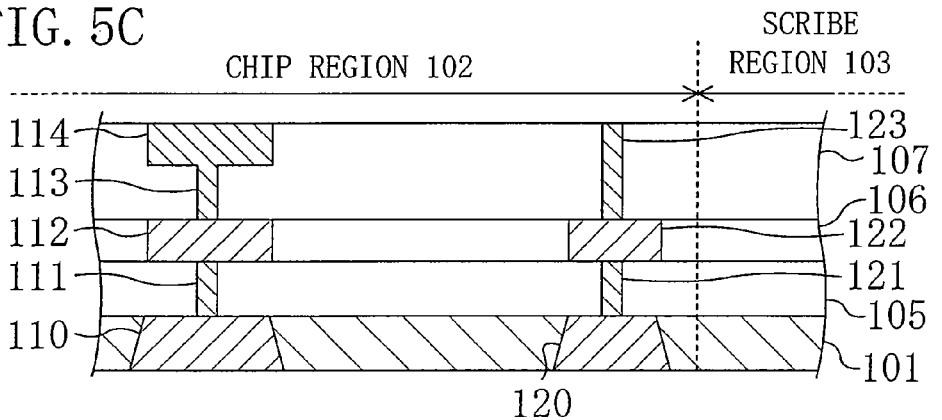

Subsequently, as shown in FIG. 5C, a conductive film made of, for example, Cu is buried in the via hole 107a, the interconnect trench 107c and the trench concave portion 107b formed in the third interlayer dielectric film 107. Then, part of the conductive film extending off the interconnect trench 107c and the trench concave portion 107b (i.e., part of the conductive film located above the third interlayer dielectric film 107) is removed by, for example, a CMP process. In this manner, a second via 113 connected to the first interconnect 112 and a second interconnect 114 connected to the second via 113 are formed (i.e., a dual damascene interconnect constituted by the second via 113 and the second interconnect 114 is formed) in the third interlayer dielectric film 107 in the chip region 102. At the same time, a second seal via 123 connected to the first seal interconnect 122 is formed through the third interlayer dielectric film 107 in the seal ring region. The process of forming a via and an interconnect by burying a conductive film in a concave portion as described above is generally called a dual damascene process.

In the case of forming the second via 113 and the second interconnect 114 by a single damascene process, different conductive films are buried in the via hole 107a for forming the second via 113 and the interconnect trench 107c for forming the second interconnect 114, respectively. Therefore, two processes of burying the conductive films are also performed on the trench concave portion 107b. These two burying processes cause a "junction" inside the second seal via 123.

However, in this embodiment, the second seal via 123 is formed by burying a conductive film only once simultaneously with the formation of an interconnect with a dual damascene structure, so that no junction between conductive films occurs inside the second seal via 123.

In the case where an interconnect with a dual damascene structure is formed in an interlayer dielectric film in the chip region 102 and a seal via constituting the seal ring 104 is formed in this interlayer dielectric film as in this embodiment, the seal via has an aspect ratio of three or more. Accordingly, the number of junctions between components of the seal ring 104 is reduced, so that the seal ring further ensures prevention of contamination of the chip region 102 from the outside.

Subsequently, as shown in FIG. 6A, a fourth interlayer dielectric film 108 is deposited on the third interlayer dielectric film 107, and then a dual damascene interconnect structure and a seal ring are formed in the fourth interlayer dielectric film 108 by a dual damascene process, in the same manner as the process steps shown in FIGS. 4D through 5C.

Specifically, as shown in FIG. 6A, through a lithography process and a dry etching process, a via hole 108a for forming a third via 115 (see FIG. 6B) is formed through the fourth interlayer dielectric film 108 in the chip region 102 and, at the same time, a trench concave portion 108b for forming a third seal via 124 is formed through the fourth interlayer dielectric film 108 in the seal ring region. Thereafter, a resist film (not shown) for forming an interconnect trench in which a third interconnect 116 (see FIG. 6B) is to be buried is formed on the fourth interlayer dielectric film 108 using a lithography process. This resist film has an opening on the interconnect region including the via hole 108a. The resist film is also buried in the trench concave portion 108b. Then, through a dry etching process using the resist film as a mask, an interconnect trench 108c for forming the third interconnect 116 is formed in an upper part of the fourth interlayer dielectric film 108 in the chip region 102 to be connected to the via hole 108a. Then, the remaining resist film is removed by ashing. In this manner, a concave portion (i.e., the via hole 108a and the interconnect trench 108c) for forming a dual damascene interconnect and a trench concave portion 108b for forming the third seal via 124 are formed in the fourth interlayer dielectric film 108.

Subsequently, as shown in FIG. 6B, a conductive film made of, for example, Cu is buried in a concave portion with the dual damascene structure in which the via hole 108a for forming the third via 115 and the interconnect trench 108c for forming the third interconnect 116 are integrated and also buried in the trench concave portion 108b for forming the third seal via 124. Then, part of the conductive film extending off the interconnect trench 108c and the trench concave portion 108b (i.e., part of the conductive film located above the fourth interlayer dielectric film 108) is removed by, for example, a CMP process. In this manner, a third via 115 connected to the second interconnect 114 and a third interconnect 116 connected to the third via 115 are formed (i.e., a dual damascene interconnect constituted by the third via 115 and the third interconnect 116 is formed) in the fourth interlayer dielectric film 108 in the chip region 102. At the same time, a third seal via 124 connected to the second seal via 123 is formed through the fourth interlayer dielectric film 108 in the seal ring region.

Thereafter, as shown in FIG. 6B, on the fourth interlayer dielectric film 108, which is the uppermost interconnect layer, a passivation film 109 serving as a protection film of this uppermost interconnect layer is deposited. Then, parts of the passivation film 109 on the third interconnect 116 and the third seal via 124, respectively, are removed by a lithography process and a dry etching process, thereby forming openings. The opening of the passivation film 109 on the third seal via 124 is in the shape of a trench completely surrounding the chip region 102.

Thereafter, as shown in FIG. 6C, an Al (aluminum) film, for example, is deposited by, for example, a spattering process over the entire surface of the passivation film 109 including the openings on the third interconnect 116 and the third seal via 124, respectively, and then this Al film is patterned into a predetermined shape by a lithography process and a dry etching process. Specifically, an unnecessary part of the Al film on the region except for the openings and their neighboring portions is removed. In this manner, a pad electrode 117 connected to the third interconnect 116 is formed in the opening of the passivation film 109 on the third interconnect 116 and a cap layer 125 connected to the third seal via 124, i.e., the seal ring 104, is formed in the opening of the passivation film 109 on the third seal via 124. In this manner, an interconnect structure and a bonding pad (pad electrode 117) for connecting the interconnect structure to an external electrode are formed in the chip region 102, whereas the seal ring 104 including the cap layer 125 at its top is formed in the seal ring region, i.e., in a peripheral part of the chip region 102.

As described above, in this embodiment, an interconnect structure is formed by using a dual damascene process with which a conductive film is buried in a hole for forming a via and a trench for forming an interconnect at the same time. This interconnect structure and a seal via constituting a seal ring are formed in the same process. Specifically, simultaneously with burying of a conductive film in an interconnect trench having a dual damascene structure in which a concave portion for forming a via and an interconnect trench for forming an interconnect are integrated, the conductive film is also buried in a concave portion for forming a seal via. Accordingly, a seal via having a sufficient height, i.e., a seal via whose aspect ratio of the depth (height) to the width, for example, is one or more (preferably three or more), is formed through one burying process.

Therefore, in this embodiment, the resultant seal ring has a smaller number of "junctions" originating from burying of conductive films, as compared to the case of forming an interconnect by a single damascene process. Specifically, a merit of a small number of processes of burying conductive films is that the number of interfaces between the conductive films constituting a seal ring is reduced. That is, discontinuous portions due to poor burying of conductive films are less likely to occur between components of a seal ring, resulting in that the resultant seal ring has higher reliability than that obtained through a large number of burying processes.

In this embodiment, the cap layer 125 connected to the top of the seal ring 104 is formed simultaneously with the formation of a pad (pad electrode 117) for supplying power from the outside to interconnect layers in the chip region 102 or for taking a signal from the interconnect layers to the outside. This makes it possible to form the cap layer 125 at the top of the seal ring 104 without an additional process for forming the cap layer.

Hereinafter, a seal ring structure of this embodiment shown in FIG. 2A will be described specifically.

As shown in FIG. 2A (or FIG. 6C), the seal ring of this embodiment is formed in the chip region 102 near the boundary between the chip region 102 and the scribe region 103. An element (not shown) such as a transistor is formed on the substrate 101 in the chip region 102, and a plurality of interconnect layers are formed over the element such as a transistor.

As shown in FIG. 2A, in the peripheral part of the chip region 102 as described above, the seal ring 104 as a combination of the conductive layer 120, the seal vias 121, 123 and 124 and the seal interconnect 122 is formed to surround the inside of the chip region 102, i.e., the above-mentioned element and interconnect layers and to penetrate the multilayer structure made of a plurality of interlayer dielectric films 105 through 108. Specifically, the seal ring 104 is made of a conductor (e.g., Cu) continuously buried from the lowermost interlayer dielectric film through the uppermost interlayer dielectric film without interruption (without gaps) in the multilayer structure in the peripheral part of the chip region 102 (i.e., in the chip region 102 near the boundary between the chip region 102 and the scribe region 103.) This seal ring 104 serves as a barricade for blocking the passage of entering of an impurity and the like from the outside into the chip region 102.

In this embodiment, at least one conductor (component) out of stacked conductors constituting the seal ring 104 and an interconnect with a dual damascene structure are formed by the same process as described above. Accordingly, this conductor serves as a seal via penetrating at least one interlayer dielectric film without a "junction". That is, the seal ring 104 is formed in the process for forming a dual damascene interconnect in the entire chip region 102 in which a seal ring, an element such as a transistor, an interconnect and others are formed, so that the number of "junctions" in the seal ring 104 is reduced. If a "junction", i.e., an interface between conductive films serving as components, is present in the seal ring, this "junction" serves as a path through which impact caused during, for example, dicing of the substrate (wafer) 101 along the scribe region 103 or moisture entering from the outside easily propagates into the chip region 102. However, in this embodiment, the number of "junctions" between components of the seal ring 104 is reduced, so that it is possible to prevent impact during wafer dicing or moisture from the outside from entering the chip region 102.

In this embodiment, the seal ring 104 is formed in the peripheral part of the chip region 102 (in the chip region 102 near the boundary between the chip region 102 and the scribe region 103). Accordingly, when the substrate (wafer) 101 on which a plurality of semiconductor devices are formed is diced along the scribe region 103 so as to obtain the individual semiconductor devices as chips, it is possible to prevent mechanical impact or stress on the scribe region 103 during the dicing from propagating into the chip region 102.

In the seal ring structure shown in FIG. 2A, the cap layer 125 of, for example, Al on the third seal via 124 formed on the uppermost interlayer dielectric film (i.e., fourth interlayer dielectric film 108) is formed in an opening provided in part of the protection film (passivation film 109) on the third seal via 124, i.e., is formed in a trench provided in the passivation film 109 to completely surround an interconnect layer and others formed in the chip region 102. Specifically, the cap layer 125 connected to the top of the seal ring 104 is formed to protrude from the surface of the passivation film 109. Accordingly, the passivation film 109 partially opens to be discontinuous.

In this embodiment, part of the passivation film 109 located in the chip region 102 and part of the passivation film 109 located outside the seal ring region (including the scribe region 103) are discontinuous, so that mechanical impact on the passivation film 109 near the scribe region 103 during dicing is less likely to propagate into films such as the passivation film 109 deposited in the chip region 102. That is, the passivation film 109 is partially discontinuous in the chip region 102 near the boundary between the chip region 102 and the scribe region 103, so that it is possible to prevent impact during dicing of the wafer from reaching the chip region 102.

Accordingly, it is possible to prevent the phenomenon that impact during dicing causes cracks or the like in part of the passivation film 109 located in the scribe region 103 to make the passivation film 109 and others peel off in the chip region 102. This avoids occurrence of cracks in the chip region 102. As a result, it is possible to prevent a contaminant such as moisture or mobile ions from entering the chip from the chip surface, thus enhancing the reliability of semiconductor devices.

In addition, the cap layer 125 is buried in the opening of the passivation film 109 on the seal ring 104 so that the cap layer 125 and the body of the seal ring 104 are continuous. Accordingly, unlike a case where the cap layer 125 is not provided, it is possible to prevent moisture or an impurity which has entered from the scribe region 103 during dicing from penetrating into the chip region 102 via the peripheral part of the chip region 102, i.e., the opening of the passivation film 109 near the scribe region 103.

In the seal ring structure of this embodiment shown in FIG. 2A, the seal ring 104 is preferably narrow in part (specifically, the seal vias 121, 123 and 124). Specifically, the aspect ratio (the ratio of the height to the width) of this part is preferably one or more. In particular, the aspect ratio of a seal via formed without "junctions" through an interlayer dielectric film in which a dual damascene interconnect is formed is preferably three or more. Alternatively, in a case where seal vias (e.g., the seal vias 123 and 124) are respectively formed through two or more successive interlayer dielectric films, the aspect ratio of the structure of these stacked seal vias is preferably three or more. In this manner, if seal vias are used as conductors which are components of the seal ring 104, a margin for disposing the seal ring can be adjusted to some degree in accordance with an interconnect layout in interlayer dielectric films by utilizing the fact that the widths of vias are smaller than those of interconnects. That is, in an interlayer dielectric film in which a wide range of the chip region 102 needs to be used to dispose an interconnect layer and others, a seal via is preferably used as a component of the seal ring 104.

On the other hand, if the space for forming a seal ring therein in a target interlayer dielectric film has a margin in consideration of an interconnect layout of the chip region 102 and others, a seal interconnect having substantially the same width as an interconnect can be used. That is, a seal ring is formed by using a mask provided with a seal interconnect pattern having substantially the same width as an interconnect pattern.

As described above, in this embodiment, the width of each component of a seal ring is selected for each dielectric film under consideration of an interconnect layout of the chip region 102. Accordingly, the width (thickness) of each dielectric film for the seal ring is controlled as necessary.

In this embodiment, instead of the seal ring structure shown in FIG. 2A, i.e., a seal ring structure in which at least two seal vias are continuously stacked, a seal ring 104 in which seal vias and seal interconnects are alternately stacked in the same manner as in the seal ring structure shown in FIG. 2B, i.e., an interconnect structure in which vias and interconnects are alternately stacked in the chip region 102 where an element and others are formed, may be used.

Hereinafter, the seal ring structure shown in FIG. 2B will be described specifically. In FIG. 2B, components already shown in FIG. 2A are denoted by the same reference numerals, and thus the description thereof will be omitted.

As shown in FIG. 2B, the seal ring 104 is formed simultaneously with the formation of an interconnect structure in the chip region 102. Specifically, a first seal via 121 is formed through a first interlayer dielectric film 105 on a conductive layer 120. A first seal interconnect 122 is formed through a second interlayer dielectric film 106 on the first interlayer dielectric film 105 to be connected to the first seal via 121. In a third interlayer dielectric film 107 deposited on the second interlayer dielectric film 106, an interconnect (seal portion) with a dual damascene structure in which a second seal via 126 connected to the first seal interconnect 122 and a second seal interconnect 127 connected to the second seal via 126 are integrated is formed. In a fourth interlayer dielectric film 108 on the third interlayer dielectric film 107, a seal portion with a dual damascene structure in which a third seal via 128 connected to the second seal interconnect 127 and a third seal interconnect 129 connected to the third seal via 128 are integrated is formed. A passivation film 109 formed on the fourth interlayer dielectric film 108 has an opening on top of the third seal interconnect 129. A cap layer 125 connected to the third seal interconnect 129 is formed in this opening.

In this manner, the semiconductor device of this embodiment shown in FIG. 2B includes the seal ring 104 with a structure similar to that of an interconnect structure formed in the chip region 102, so that the seal ring 104 and the interconnect are formed by the same process.

In addition, in the semiconductor device of this embodiment shown in FIG. 2B, an interconnect structure, e.g., the second via 113 and the second interconnect 114, and components of the seal ring 104, e.g., the second seal via 126 and the second seal interconnect 127, are formed by the same dual damascene process. Accordingly, a concave portion for forming the second seal via 126 and a trench for forming the second seal interconnect 127 are integrated, so that the concave portion and the trench are filled with a conductive film at the same time. As a result, no "junction" is present between the second seal via 126 and the second seal interconnect 127. Specifically, if an interconnect structure and a seal ring 104 are formed by a dual damascene process in the manner as in this embodiment, the number of "junctions" in the seal ring 104 is reduced, thereby forming the seal ring 104 capable of preventing moisture or an impurity from entering the chip region 102 from the outside of the scribe region 103 and others. As a result, the moisture resistance of semiconductor chips (semiconductor devices) is enhanced and the semiconductor chips are manufactured with high yield.

The seal ring structure shown in FIG. 2B is formed using photo masks in which a mask pattern for forming an interconnect structure in the chip region 102 and a mask pattern for forming a seal ring coincide with each other with respect to the same interlayer dielectric film. For example, when an interconnect with a dual damascene structure in which a via (plug) and an interconnect are integrated is formed in the interlayer dielectric film 107 in the chip region 102, a dual damascene process is also employed to form a component of the seal ring 104 in this interlayer dielectric film 107. Specifically, the component of the seal ring 104 formed in the interlayer dielectric film 107 is constituted by the second seal via 126 having substantially the same width as the second via 113 and the second seal interconnect 127 having substantially the same width as the second interconnect 114. In the interlayer dielectric film 107, the multilayer structure made of the second seal via 126 and the second seal interconnect 127 is formed to vertically penetrate the interlayer dielectric film 107 and completely surround (without an interruption) the chip region 102.

The seal ring 104 shown in FIG. 2B is formed by alternately stacking seal interconnects and seal vias and the width of a seal interconnect is larger than that of the associated seal via. Accordingly, the strength of the seal ring is enhanced, as compared to a seal ring formed by stacking only seal vias or stacking seal vias for the most part.

The method for fabricating a semiconductor device with the structure shown in FIG. 2B is different from that for fabricating a semiconductor device with the structure shown in FIG. 2A only in mask patterns for forming the seal ring in respective photo masks. Specifically, in forming the seal ring 104 shown in FIG. 2A, for example, mask patterns for forming the seal ring in respective masks which have been predetermined so as to form the third seal via 124 on the second seal via 123 are altered in the formation of the seal ring 104 shown in FIG. 2B. More specifically, mask patterns for forming a seal ring in respective masks are defined such that the second seal interconnect 127 is formed on the second seal via 126 and the third seal interconnect 129 is formed on the third seal via 128, i.e., such that seal vias and seal interconnects are alternately formed.

Hereinafter, the seal ring structure shown in FIG. 3A, i.e., a seal ring 104 in which a seal via is divided into at least two branches in an interlayer dielectric film, will be described specifically. In FIG. 3A, components already shown in FIG. 2A are denoted by the same reference numerals, and thus the description thereof will be omitted.

The seal ring structure shown in FIG. 3A is different from that shown in FIG. 2A in the following aspects. First, instead of the first seal via 121, seal vias 121a and 121b connected to the conductive layer 120 are provided through the first interlayer dielectric film 105. Second, instead of the second seal via 123, seal vias 123a and 123b connected to the first seal interconnect 122 are provided through the third interlayer dielectric film 107. Third, instead of the third seal via 124, seal vias 124a and 124b connected to the respective seal vias 123a and 123b are provided through the fourth interlayer dielectric film 108. The tops of the respective seal vias 121a and 121b are connected to the first seal interconnect 122, and the tops of the respective seal vias 124a and 124b are connected to the cap layer 125.

That is, the method for fabricating a semiconductor device with the structure shown in FIG. 3A is different from that for fabricating a semiconductor device with the structure shown in FIG. 2A in that mask patterns for forming two seal vias are provided in photo masks for use in etching of an interlayer dielectric film, and a conductive film is buried in a pair of parallel trench concave portions formed by using these mask patterns.

In addition to the advantages obtained by the seal ring structure shown in FIG. 2A, the seal ring structure shown in FIG. 3A has the following advantages. Since a seal via is narrower than a seal interconnect, the strength of the seal via is relatively lower than that of the seal interconnect. On the other hand, if a seal via divided into at least two branches is used instead of a single seal via as a component of a seal ring as in the seal ring structure shown in FIG. 3A, the seal ring partially has a multiplex structure (i.e., a structure in which the chip region 102 is surrounded by multiple seal ring branches) in an interlayer dielectric film in which the seal via is divided into the branches. Accordingly, as compared to a seal ring which is not divided into branches in an interlayer dielectric film (i.e., which has a single structure), the strength of the seal ring with the multiplex structure shown in FIG. 3A is enhanced. It should be noted that in terms of processing, the seal ring structure shown in FIG. 2A is more easily implemented than the seal ring structure shown in FIG. 3A.

With the seal ring structure shown in FIG. 3A, even if the seal ring 104 is damaged in part by impact involved in dicing of a wafer (substrate 101) into chips along the scribe region 103, it is possible to prevent the chip region 102 inside the scribe region 103 from being affected by the impact as long as the seal ring 104 in this damaged part has a multiplex structure including two or more branches. Specifically, it is possible to suppress entering of moisture from the scribe region 103 into the chip region 102 or propagation of the impact during dicing of the wafer along the scribe region 103 into the chip region 102.

The seal ring 104 shown in FIG. 3A has a structure in which a seal via is divided into two branches connected to one seal interconnect. Alternatively, a seal via may be divided into three or more branches connected to one seal interconnect. In the seal ring 104 shown in FIG. 3A, each of the seal vias is divided into a plurality of branches in a film. Alternatively, the seal via may be selectively divided into branches in each film, depending on a margin on a layout necessary for an interconnect layer formed in the chip region 102, or the strength of a film (interlayer dielectric film), for example.

In this embodiment, an interconnect structure is formed in four stacked interlayer dielectric films. However, the number of interlayer dielectric films is not limited to four and may of course be smaller or greater than four depending on the structure of a chip.

In this embodiment, Cu is used as a conductive material constituting the seal ring 104. However, the present invention is not limited to this, and the seal ring 104 may be made of at least one of W, Al and Cu. Then, the seal ring 104 is formed out of the same material as interconnects and vias formed in the chip region 102 of a semiconductor device.

In this embodiment, the conductive material constituting the cap layer 125 is not specifically limited. However, use of Al as the conductive material ensures prevention of erosion of the seal ring 104 (especially a seal ring made of Cu.)

In this embodiment, in a case where a plurality of seal vias are continuously stacked as in the seal ring structure shown in FIG. 2A or 3A, for example, the contact surface of an upper seal via or a lower seal via is preferably larger than that of the other seal via. Then, the contact margin is enhanced.

Embodiment 2

Hereinafter, a semiconductor device and a method for fabricating the device according to a second embodiment of the present invention will be described with reference to drawings.

FIG. 7 is a plan view showing part of a wafer on which a semiconductor device of the second embodiment (i.e., a semiconductor device in which a chip region is surrounded by two seal rings) is provided. Hereinafter, a seal ring structure including two or more seal rings surrounding a chip region will be also referred to as a multi-seal ring structure.

As shown in FIG. 7, on a wafer 201 to be a semiconductor substrate, typically a silicon substrate, for example, a plurality of chip regions 202 to be semiconductor devices, are provided. In each of the chip regions 202, an IC made of a plurality of elements and provided with a given function is formed. The chip regions 202 are defined by a scribe region 203 having a lattice pattern.

A semiconductor device (i.e., a semiconductor chip) includes: an IC (located in the chip region 202) made of a plurality of elements and provided with a given function; and seal rings 204a and 204b provided in a peripheral part of the chip region 202 to surround the chip region 202. In this embodiment, a multi-seal ring structure including two seal rings is used. Alternatively, a multi-seal ring including three, four or more seal rings may be used depending on a margin on a layout.

After formation of chips has been completed, the wafer 201 on which a plurality of semiconductor devices each having its chip region 202 surrounded by the multi-seal ring structure 204 are formed is diced along the scribe region 203, thereby separating the semiconductor devices from each other.

In this embodiment, the seal ring structure 204 having at least two seal rings is formed in the chip region 202 near the scribe region 203. Accordingly, even if one of the seal rings (e.g., the outermost seal ring) is damaged during dicing of the wafer 201, damage to an element, an active region and others in the chip region 202 is prevented by the other inner seal ring(s). This eliminates degradation of performance of a semiconductor chip caused by occurrence of a crack in the chip region 202, including an element, an active region and others, during dicing of the wafer 201 into chips.

Figure 8A:
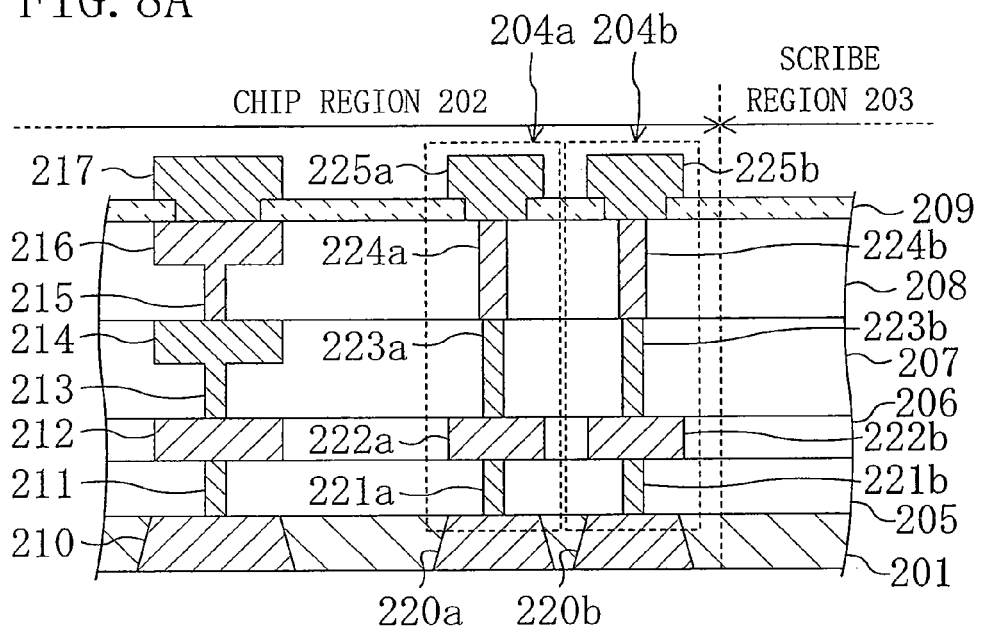
FIGS. 8A and 8B are views respectively showing variations of the cross-sectional structure taken along the line B-B' in FIG. 7 (i.e., cross-sectional structure of an end of a semiconductor device including a seal ring portion located in a peripheral part of a chip region.)
Figure 8B:
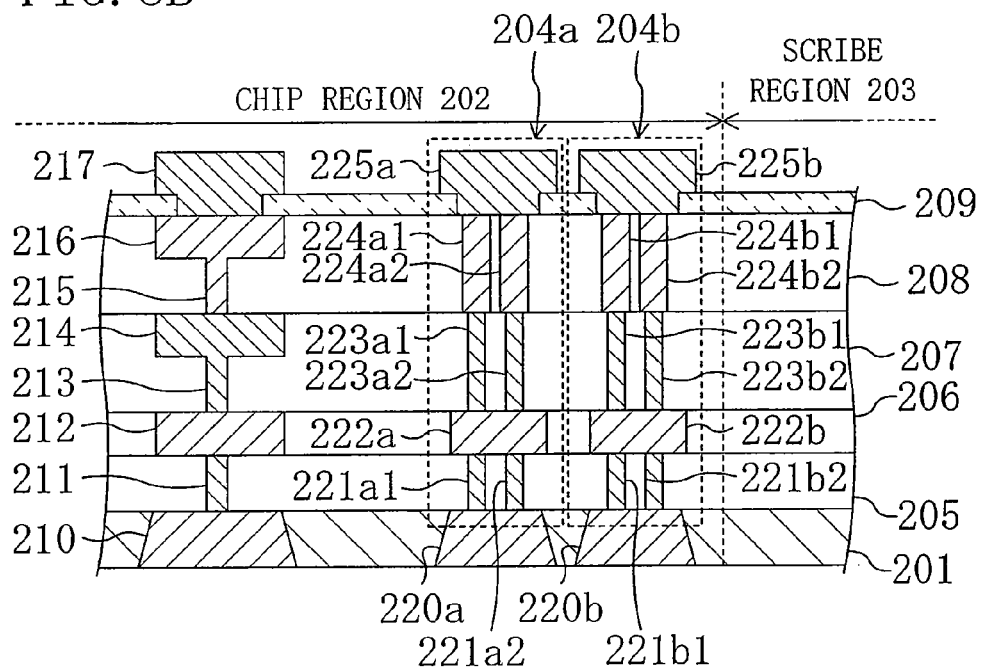

FIGS. 8A and 8B show variations of the cross-sectional structure taken along the line B-B' in FIG. 7 (the cross-sectional structure of an end of a semiconductor device including a seal ring portion located in a peripheral part of the chip region 202.)

As shown in FIGS. 7, 8A and 8B, a semiconductor device before dicing includes the chip regions 202 and the scribe region 203, and the seal rings 204a and 204b are formed in the chip region 202 near the boundary between the chip region 202 and the scribe region 203.

Now, features of the respective structures shown in FIGS. 8A and 8B will be described specifically.

First, the structure shown in FIG. 8A has a feature in which seal vias constituting each of the seal rings 204a and 204b are continuously formed through at least two successive films.

Next, the structure shown in FIG. 8B has a feature in which seal vias constituting each of the seal rings 204a and 204b are continuously formed through at least two successive films, two or more adjacent seal vias are formed in the same interlayer dielectric film, and these two or more adjacent seal vias are connected to one seal interconnect formed in a dielectric film located on top or bottom of the film in which the seal vias are formed. That is, each seal via constituting the seal ring structure 204 shown in FIG. 8B is divided into two or more branches in the same interlayer dielectric film.

On the other hand, the structures shown in FIGS. 8A and 8B have a common feature in which the seal ring structure 204 includes at least two seal rings and seal ring caps (cap layers 225a and 226b) are provided at the tops of the respective seal rings 204a and 204b.

Hereinafter, a method for fabricating a semiconductor device having the structure shown in FIG. 8A will be described with reference to FIGS. 9A through 9D and 10A through 10C.

Figure 9A:
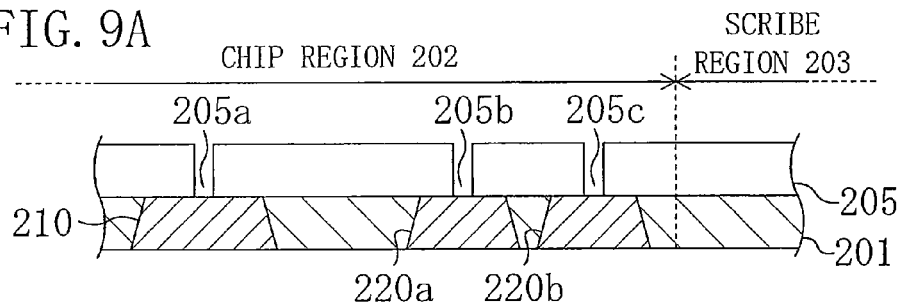
FIGS. 9A through 9D are cross-sectional views showing respective process steps of a method for fabricating a semiconductor device according to the second embodiment.

First, as shown in FIG. 9A, an active layer 210 constituting an element such as a transistor is formed in a wafer 201 (hereinafter, referred to as a substrate 201) in a chip region 202. At the same time, two adjacent conductive layers 220a and 220b are formed in the substrate 201 in a peripheral part of the chip region 202 (a seal ring region near a scribe region 203.) The conductive layers 220a and 220b have similar configuration as that of the active layer 210.

Then, a first interlayer dielectric film 205 is deposited on the substrate 201. Subsequently, through a lithography process and a dry etching process, a via hole 205a for forming a first via 211 (see FIG. 9B) is formed through the first interlayer dielectric film 205 in the chip region 202 and, at the same time, trench concave portions 205b and 205c for forming first seal vias 221a and 221b (see FIG. 9B) on the respective adjacent conductive layers 220a and 220b are formed through the first interlayer dielectric film 205 in the seal ring region. The seal vias are components of seal rings and are formed by filling the trench concave portions with a conductive material. Specifically, each seal via has a line structure having substantially the same width as a via in the chip region.

In this embodiment, the aspect ratio of a seal via (i.e., the ratio of the depth to the width in a concave portion in which the seal via is buried) is preferably one or more. In particular, in the case where seal vias are formed simultaneously with an interconnect layer as in this embodiment, the aspect ratio of each seal via is preferably set at three or more in accordance with the degree of miniaturization of interconnects.

In this embodiment, the trench concave portions 205b and 205c for forming the first seal vias 221a and 221b and the via hole 205a are formed at the same time in the first interlayer dielectric film 205 in the chip region 202. Alternatively, the via hole 205a and the trench concave portions 205b and 205c may of course be formed individually.

Figure 9B:
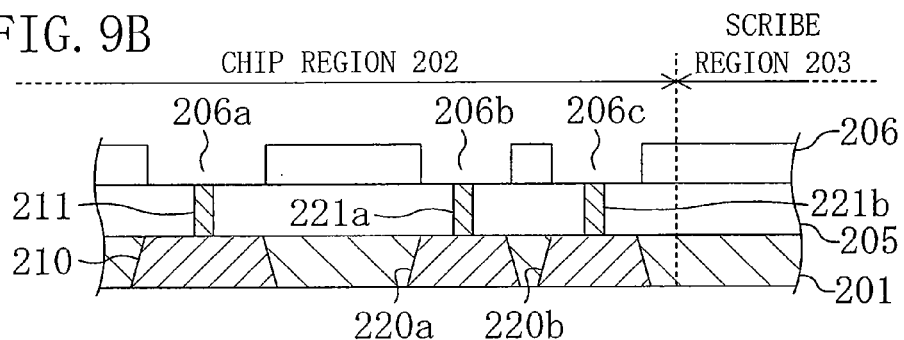

Next, as shown in FIG. 9B, the via hole 205a and the trench concave portions 205b and 205c formed through the first interlayer dielectric film 205 are filled with a conductive film made of, for example, W by, for example, a CVD process. Then, an unnecessary part of the conductive film extending off the via hole 205a and the trench concave portions 205b and 205c is removed by, for example, a CMP process, thereby forming a first via 211 connected to the active layer 210 and adjacent first seal vias 221a and 221b connected to the respective conductive layers 220a and 220b.

Thereafter, a second interlayer dielectric film 206 is deposited on the first interlayer dielectric film 205. Then, through a lithography process and a dry etching process, an interconnect trench 206a for forming a first interconnect 212 (see FIG. 9C) is formed through the second interlayer dielectric film 206 in the chip region 202, and at the same time, interconnect trenches 206b and 206c for forming adjacent first seal interconnects 222a and 222b (see FIG. 9C) are formed through the second interlayer dielectric film 206 in the seal ring region.

Figure 9C:
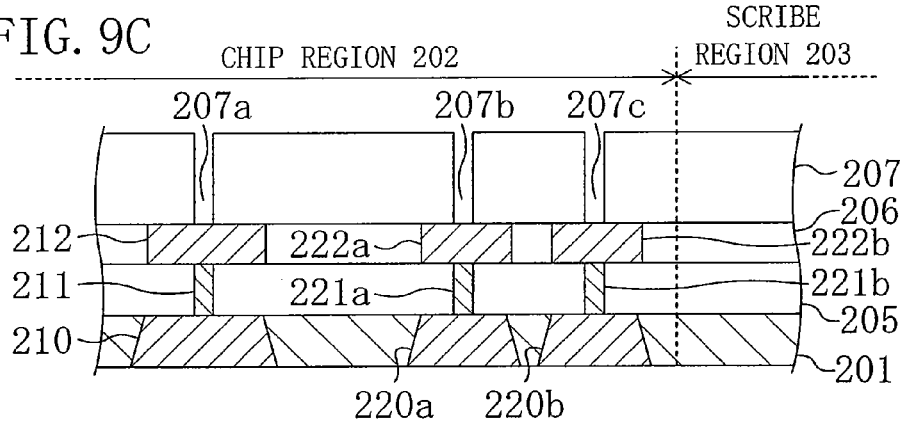

Then, as shown in FIG. 9C, the interconnect trenches 206a, 206b and 206c formed through the second interlayer dielectric film 206 are filled with a conductive film of, for example, Cu by, for example, an electroplating process. Thereafter, part of the conductive film extending off the interconnect trenches 206a, 206b and 206c is removed by, for example, a CMP process, thereby forming a first interconnect 212 connected to the first via 211 and adjacent first seal interconnects 222a and 222b connected to the respective first seal vias 221a and 221b.

Subsequently, a third interlayer dielectric film 207 is deposited on the second interlayer dielectric film 206, and then a via hole 207a for forming a second via 213 (see FIG. 10A) is formed through the third interlayer dielectric film 207 in the chip region 202. At the same time, trench concave portions 207b and 207c for forming adjacent second seal vias 223a and 223b (see FIG. 10A) are formed through the third interlayer dielectric film 207 in the seal ring region.

Figure 9D:
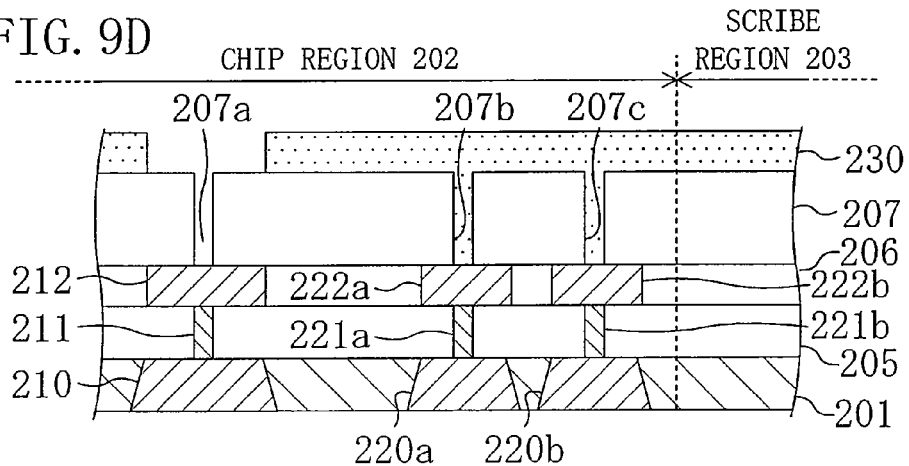

Then, as shown in FIG. 9D, a resist film 230 for forming an interconnect trench in which a second interconnect 214 (see FIG. 10A) is to be buried is formed on the third interlayer dielectric film 207 using a lithography process. This resist film 230 has an opening on an interconnect region including the via hole 207a. The resist film 230 is also buried in the trench concave portions 207b and 207c.

Thereafter, through a dry etching process using the resist film 230 as a mask, an interconnect trench connected to the via hole 207a and used for forming the second interconnect 214 is formed in an upper part of the third interlayer dielectric film 207 in the chip region 202. Then, the remaining resist film 230 is removed by ashing. Thereafter, a conductive film made of, for example, Cu is buried in the via hole 207a, the interconnect trench integrated with the via hole 207a to form a concave portion with a dual damascene structure, and the trench concave portions 207b and 207c formed in the third interlayer dielectric film 207 by the previous process steps.

Figure 10A:
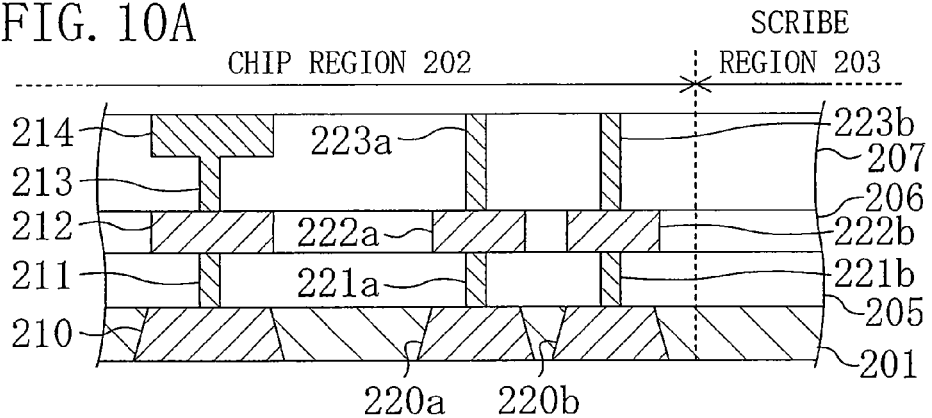
FIGS. 10A through 10C are cross-sectional views showing respective process steps of the method for fabricating the semiconductor device of the second embodiment.

Then, part of the conductive film extending off the interconnect trench and the trench concave portions 207b and 207c (i.e., part of the conductive film located above the third interlayer dielectric film 207) is removed by, for example, a CMP process. In this manner, as shown in FIG. 10A, a second via 213 connected to the first interconnect 212 and a second interconnect 214 connected to the second via 213 are formed (i.e., a dual damascene interconnect constituted by the second via 213 and the second interconnect 214 is formed) in the third interlayer dielectric film 207 in the chip region 202. At the same time, two adjacent second seal vias 223a and 223b connected to the respective first seal interconnects 222a and 222b are formed through the third interlayer dielectric film 207 in the seal ring region. The process of simultaneously forming a via and an interconnect by burying a conductive film in a concave portion as described above is generally called a dual damascene process.

If the second via 213 and the second interconnect 214 are formed by a single damascene process, different conductive films are buried in the via hole 207a for forming the second via 213 and the interconnect trench for forming the second interconnect 214, respectively. Therefore, since this interconnect structure and the second seal vias 223a and 223b are formed by the same process, two burying processes of the conductive films are also performed on the trench concave portions 207b and 207c. In this case, "junctions" created by these two burying processes occur inside the second seal vias 223a and 223b.

However, in this embodiment, the second seal vias 223a and 223b are formed by burying a conductive film only once in the process for forming an interconnect with a dual damascene structure, so that no junction is created between conductive films in the seal vias.

In the case where an interconnect with a dual damascene structure is formed in an interlayer dielectric film in the chip region 202 and seal vias constituting the seal ring structure 204 are formed in this interlayer dielectric film as in this embodiment, each of the resultant seal vias has an aspect ratio of three or more. Accordingly, the number of junctions between components of the seal ring structure 204 is reduced, so that a seal ring structure which further ensures prevention of contamination of the chip region 202 from the outside.

Figure 10B:
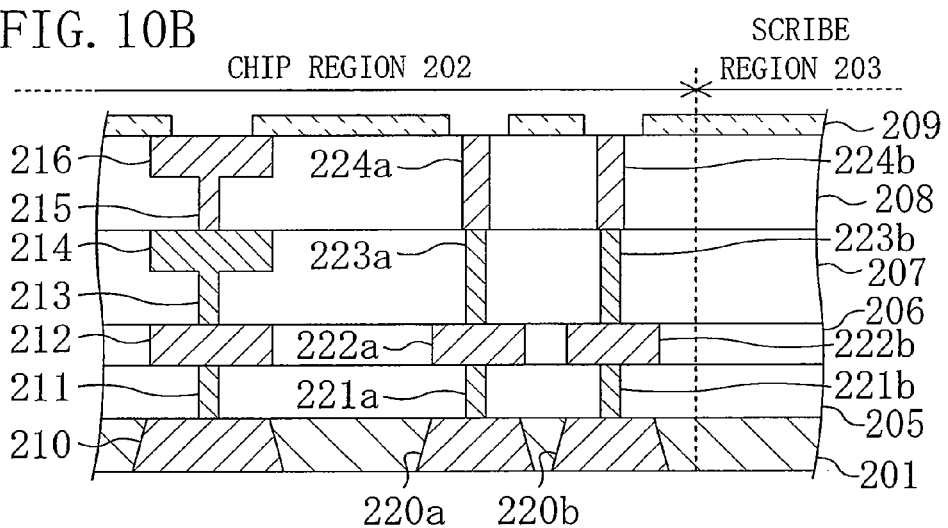

Subsequently, as shown in FIG. 10B, a fourth interlayer dielectric film 208 is deposited on the third interlayer dielectric film 207, and then an interconnect structure with a dual damascene and a seal ring are formed in the fourth interlayer dielectric film 208 by a dual damascene process, in the same manner as in the process steps shown in FIGS. 9C through 10A.

Specifically, as shown in FIG. 10B, through a lithography process and a dry etching process, a via hole for forming a third via 215 is formed through the fourth interlayer dielectric film 208 in the chip region 202 and, at the same time, two trench concave portions for forming adjacent third seal vias 224a and 224b are formed through the fourth interlayer dielectric film 208 in the seal ring region. Thereafter, a resist film (not shown) for forming an interconnect trench in which a third interconnect 216 is to be buried is formed on the fourth interlayer dielectric film 208 using a lithography process. This resist film has an opening on the interconnect region including the via hole. The resist film is also buried in the trench concave portions. Then, through a dry etching process using the resist film as a mask, an interconnect trench connected to the via hole and used for forming the third interconnect 216 is formed in an upper part of the fourth interlayer dielectric film 208 in the chip region 202. Then, the remaining resist film is removed by ashing. In this manner, a concave portion (i.e., the via hole and the interconnect trench) for forming a dual damascene interconnect and two trench concave portions for forming the third seal vias 224a and 224b are formed in the fourth interlayer dielectric film 208.

Subsequently, as shown in FIG. 10B, a conductive film made of, for example, Cu is buried in a concave portion with the dual damascene structure in which the via hole for forming the third via 215 and the interconnect trench for forming the third interconnect 216 are integrated and also buried in the trench concave portions for forming the respective third seal vias 224a and 224b, in the fourth interlayer dielectric film 208. Then, part of the conductive film extending off the interconnect trench and the trench concave portions (i.e., part of the conductive film located above the fourth interlayer dielectric film 208) is removed by, for example, a CMP process. In this manner, a third via 215 connected to the second interconnect 214 and a third interconnect 216 connected to the third via 215 are formed (i.e., a dual damascene interconnect constituted by the third via 215 and the third interconnect 216 is formed) in the fourth interlayer dielectric film 208 in the chip region 202. At the same time, third seal vias 224a and 224b connected to the respective second seal vias 223a and 223b are formed through the fourth interlayer dielectric film 208 in the seal ring region.

Thereafter, as shown in FIG. 10B, on the fourth interlayer dielectric film 208, which is the uppermost interconnect layer, a passivation film 209 serving as a protection film of this uppermost interconnect layer is deposited. Then, parts of the passivation film 209 on the third interconnect 216 and the adjacent third seal vias 224a and 224b are removed by a lithography process and a dry etching process, thereby forming openings. In this manner, the upper surfaces of the respective third interconnect 216 and the third seal vias 224a and 224b are exposed.

Figure 10C:
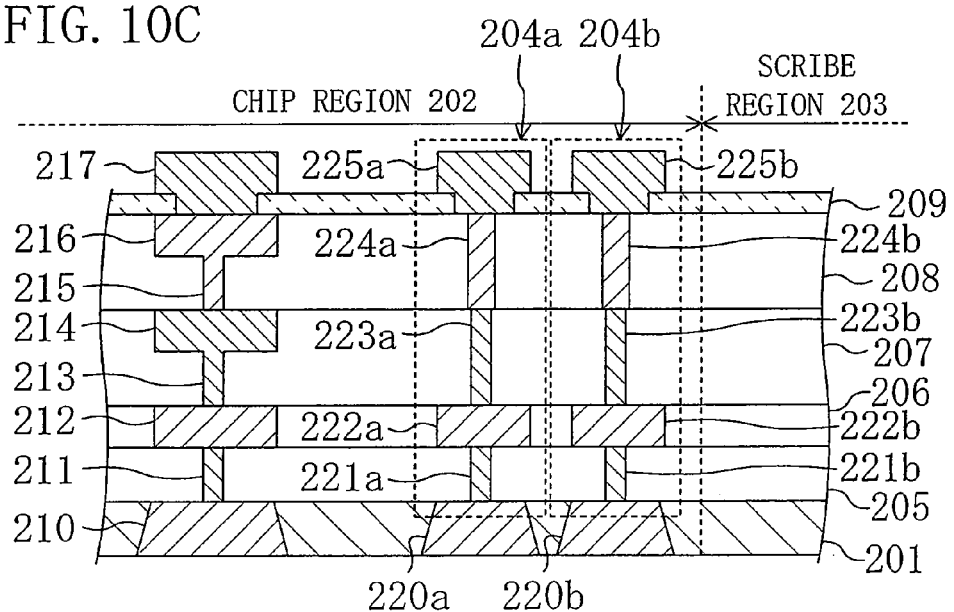

Thereafter, as shown in FIG. 10C, an Al film, for example, is deposited by, for example, a spattering process over the entire surface of the passivation film 209 including the openings on the third interconnect 216 and the third seal vias 224a and 224b. Then, this Al film is patterned into a predetermined shape by a lithography process and a dry etching process. Specifically, an unnecessary part of the Al film on the region except for the openings and their neighboring regions is removed. In this manner, a pad electrode 217 connected to the third interconnect 216 is formed in the opening of the passivation film 209 on the third interconnect 216, and cap layers 225a and 225b connected to the respective third seal vias 224a and 224b, i.e., the respective seal rings 204a and 204b, are formed in the openings of the passivation film 209 on the respective third seal vias 224a and 224b.

In this manner, an interconnect structure and a bonding pad (pad electrode 217) for connecting the interconnect structure to an external electrode are formed in the chip region 202, whereas the seal rings 204a and 204b and the cap layers 225a and 225b, which are connected to the respective seal rings 204a and 204b through the protection film (passivation film 209) deposited on the seal rings 204a and 204b, are formed in the seal ring region, i.e., in the peripheral part of the chip region 202 (near the boundary between the chip region 202 and the scribe region 203.)

As described above, in this embodiment, an interconnect structure is formed by using a dual damascene process with which a conductive film is buried in a hole for forming a via and a trench for forming an interconnect at the same time. Seal vias constituting seal rings are also formed by the process for forming the interconnect structure. Specifically, an interconnect trench with a dual damascene structure in which a concave portion for forming a via and an interconnect trench for forming an interconnect are integrated is filled simultaneously with concave portions for forming seal vias at the same time. Accordingly, the concave portions for forming seal vias having sufficient heights, i.e., concave portions for forming seal vias whose aspect ratio of the depth to the width, for example, is one or more (preferably three or more), are filled by single burying process.

Therefore, in this embodiment, the resultant seal ring structure has a smaller number of "junctions" originating from burying of conductive films, as compared to the case of forming an interconnect by a single damascene process. Specifically, a merit of a small number of burying processes of conductive films is that the number of interfaces between conductive films constituting a seal ring is reduced. That is, discontinuous portions due to poor burying of conductive films are less likely to occur between components of a seal ring, resulting in that the resultant seal ring structure exhibits higher reliability than a seal ring structure obtained through a large number of burying processes (i.e., a seal ring structure formed by a single damascene process.)

In this embodiment, the cap layers 225a and 225b connected to the tops of the respective seal rings 204a and 204b are formed simultaneously with the formation of a pad (pad electrode 217) for supplying power from the outside to an IC and others in the chip region 202 or for taking a signal from the IC and others to the outside. This allows the seal rings 204a and 204b including the cap layers 225a and 225b at their respective tops to be formed without an additional process for forming the cap layers.

In addition to the advantages obtained by the first embodiment, the second embodiment has the following advantages.

Specifically, in the second embodiment, the seal ring structure 204 including two seal rings completely surrounding the chip region 202 is formed in the peripheral part of the chip region 202. Accordingly, when the semiconductor wafer (substrate) 201 is diced along the scribe region 203 so as to obtain individual completed semiconductor chips (semiconductor devices), prevention of propagation, into the chip region 202, of mechanical impact caused by contact of a dicing blade with the scribe line (scribe region) 203 during dicing or prevention of damage to the chip region 202 due to the propagation is further ensured.

In addition, in the second embodiment, the two cap layers 225a and 225b are formed at the tops of the respective seal rings 204a and 204b, so that the following advantages are obtained.

Figure 11A:
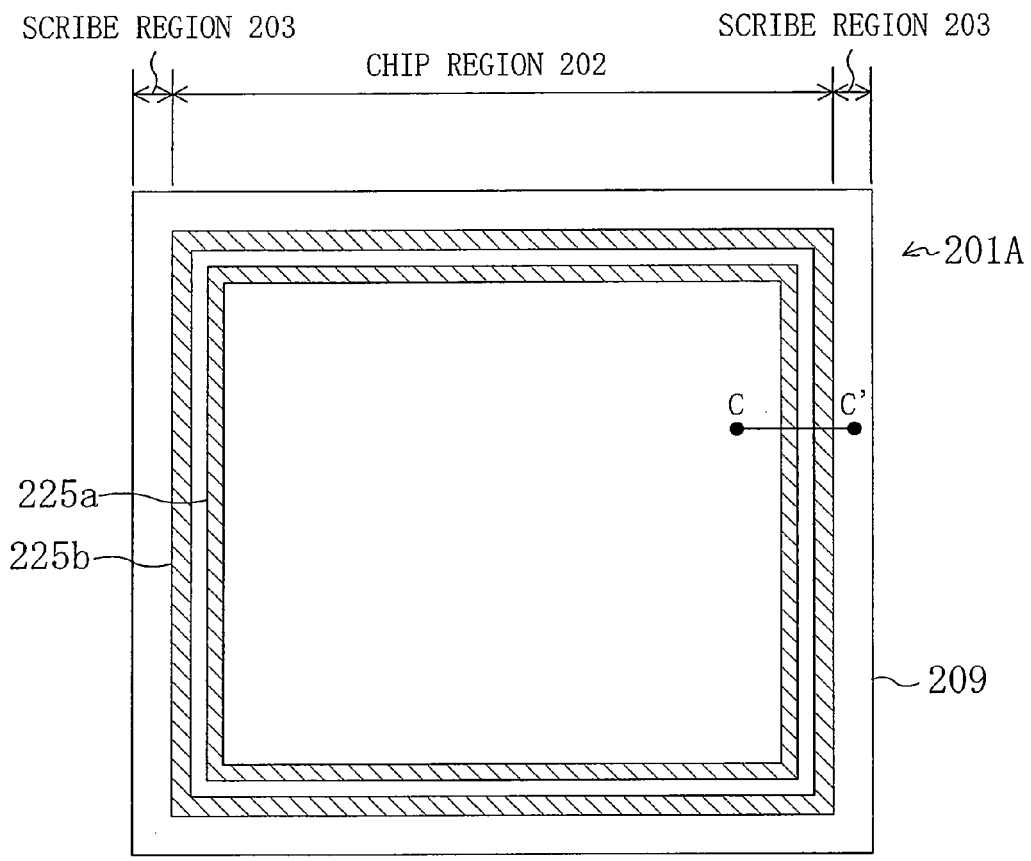
FIG. 11A is a plan view of the semiconductor device of the second embodiment when viewed from above.

FIG. 11A is a plan view showing a structure of the semiconductor device (semiconductor chip) shown in FIG. 10C (or FIG. 8A) when viewed from above (from above the passivation film (protection film) 209 formed on the uppermost interconnect layer). FIG. 11A shows one of semiconductor chips 201A formed on the wafer (substrate) 201.

As shown in FIG. 11A, the scribe region 203 is provided to surround the chip region 202, and the two seal rings 204a and 204b (not shown because these rings are formed under the cap layers 225a and 225b) are formed in the chip region 202 near the boundary between the chip region 202 and the scribe region 203. The cap layers 225a and 225b formed at the tops of the respective seal rings 204a and 204b are provided in the openings (formed by partly removing the passivation film 209) of the passivation film 209 completely surrounding the chip region 202. Accordingly, part of the passivation film 209 in the chip region 202 and part of the passivation film 209 in the scribe region 203 are separated from each other by these two cap layers 225a and 225b. That is, connection between the scribe region 203 and the chip region 202 via the passivation film 209 is not established, so that impact on part of the passivation film 209 in the scribe region 203 during dicing hardly propagates through the passivation film 209 into the chip region 202.

Figure 11B:
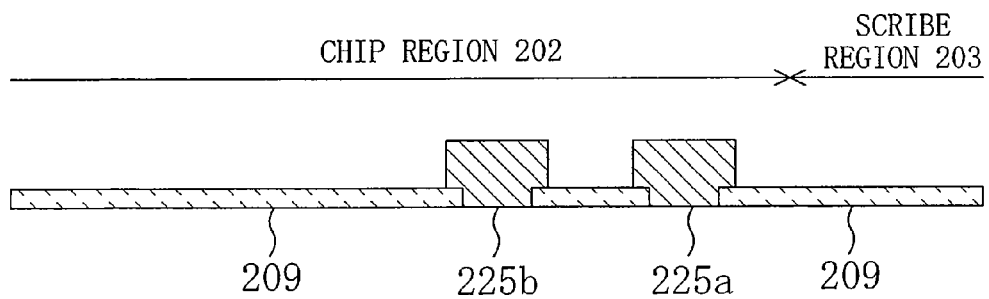
FIG. 11B is a cross-sectional view of a chip surface taken along the line C-C' in FIG. 11A.

FIG. 11B is a cross-sectional view showing the surface of a chip taken along the line C-C' in FIG. 11A.

As shown in FIG. 11B, the two cap layers 225a and 225b are formed through the passivation film 209 in the peripheral part of the chip region 202. Accordingly, it is possible to prevent impact, stress or the like on the passivation film 209 in the scribe region 203 caused by contact with a dicing blade during dicing from affecting a circuit, an interconnect structure and others inside the chip region 202.

Hereinafter, the seal ring structure shown in FIG. 8B, i.e., a structure in which each of the seal vias constituting the seal rings 204a and 204b is divided into at least two branches in an interlayer dielectric film, will be described specifically. In FIG. 8B, components also shown in FIG. 8A are denoted by the same reference numerals, and thus the description thereof will be omitted.

The seal ring structure shown in FIG. 8B is different from that of the seal ring structure shown in FIG. 8A in that each of the seal vias constituting the seal rings 204a and 204b is divided into at least two in an interlayer dielectric film.

Specifically, for the inner seal ring (first seal ring) 204a in the double structure including the first seal ring 204a and the outer seal ring (second seal ring) 204b, seal vias 221a1 and 221a2 connected to the conductive layer 220a are provided instead of the first seal via 221a in the first interlayer dielectric film 205, seal vias 223a1 and 223a2 connected to the first seal interconnect 222a are provided instead of the second seal via 223a in the third interlayer dielectric film 207, and seal vias 224a1 and 224a2 connected to the respective seal vias 223a1 and 223a2 are provided instead of the third seal via 224a in the fourth interlayer dielectric film 208. The tops of the respective seal vias 221a1 and 221a2 are connected to the first seal interconnect 222a, and the tops of the respective seal vias 224a1 and 224a2 are connected to the cap layer (first cap layer) 225a.

For the second seal ring 204b located adjacent to the first seal ring 204a and outside the first seal ring 204a, seal vias 221b1 and 221b2 connected to the conductive layer 220b are provided instead of the first seal via 221b in the first interlayer dielectric film 205, seal vias 223b1 and 223b2 connected to the first seal interconnect 222b are provided instead of the second seal via 223b in the third interlayer dielectric film 207, and seal vias 224b1 and 224b2 connected to the respective seal vias 223b1 and 223b2 are provided instead of the third seal via 224b in the fourth interlayer dielectric film 208. The tops of the respective seal vias 221b1 and 221b2 are connected to the first seal interconnect 222b, and the tops of the respective seal vias 224b1 and 224b2 are connected to the cap layer (second cap layer) 225b.

As described above, the seal rings 204a and 204b shown in FIG. 8B have a structure in which a plurality of branches of a seal via (or a multilayer structure of such branches) are bundled by at least one seal interconnect. Accordingly, even if the width (thickness) of each seal via is small, the bundle of the branches provides the seal rings with high strength as a whole. Therefore, even if mechanical impact or stress is applied to the scribe region 203 during dicing, it is possible to prevent the seal ring 204a or 204b from being damaged or prevent damage to part of the seal ring 204a or 204b (i.e., one of the branches of seal vias) from affecting the chip region 202.

In the seal ring structure shown in FIG. 8B, each of the seal vias constituting the seal rings 204a and 204b is selectively divided into two, three, four or more in an interlayer dielectric film, thus enhancing protection of the chip region 202. That is, prevention of propagation of impact or stress during dicing into the chip region 202 is further ensured.

In the seal ring structure shown in FIG. 8B, as in the seal ring structure shown in FIG. 8A, even if the outer second seal ring 204b is damaged, it is still possible to prevent a contaminant such as moisture or mobile ions from entering the chip region 202 and thereby degradation of the reliability of a semiconductor device is avoided, as long as the first seal ring 204a, which is electrically insulated from the second seal ring 204b, is not damaged and has its shape maintained.

In the seal ring structure shown in FIG. 8B, a seal via is divided into two branches connected to one seal interconnect. Alternatively, the seal via may be divided into three or more branches connected to one seal interconnect. That is, the number of branches of a seal via may be appropriately selected in accordance with a margin on the layout of the chip region 202 or the strength of the film (interlayer dielectric film.)

In the seal rings 204a and 204b shown in FIGS. 8A and 8B, instead of the structure in which two or more seal vias are continuously stacked, a structure in which seal vias and seal interconnects are alternately stacked, e.g., an interconnect structure in which vias and interconnects are alternately stacked in the chip region 202 including an element and others are formed, may be used. In such a case, the same advantages as those obtained in this embodiment are obtained. It should be noted that a seal ring using a seal interconnect has a larger width than that using a seal via. Therefore, it is preferable to determine whether a seal interconnect is used or not in consideration of layouts of respective interconnect layers.

In this embodiment, an interconnect structure is formed in four successive interlayer dielectric films. However, the number of such interlayer dielectric films is not limited to four and may of course be smaller or larger than four, depending on the structure of the chip.

In this embodiment, Cu is used as a conductive material constituting the seal rings 204a and 204b. However, the present invention is not limited to this, and the seal rings 204a and 204b may be made of at least one of W, Al and Cu. Then, the seal rings 204a and 204b are formed out of the same material as that constituting interconnects and vias formed in the chip region 202 of a semiconductor device.

In addition, in this embodiment, the conductive material constituting the cap layers 225a and 225b is not specifically limited. However, if the conductive material is Al, prevention of erosion of the seal rings 204a and 204b (especially seal rings made of Cu) is ensured.

Moreover, in this embodiment, if a plurality of seal vias are continuously stacked as in the seal ring structures shown in FIGS. 8A and 8B, for example, the contact surface of an upper seal via or a lower seal via is preferably larger than that of the other seal via. Then, the contact margin is increased.

Modified Example 1 of Embodiment 2

Hereinafter, a semiconductor device and a method for fabricating the device according to a first modified example of the second embodiment will be described with reference to drawings.

Figure 12A:
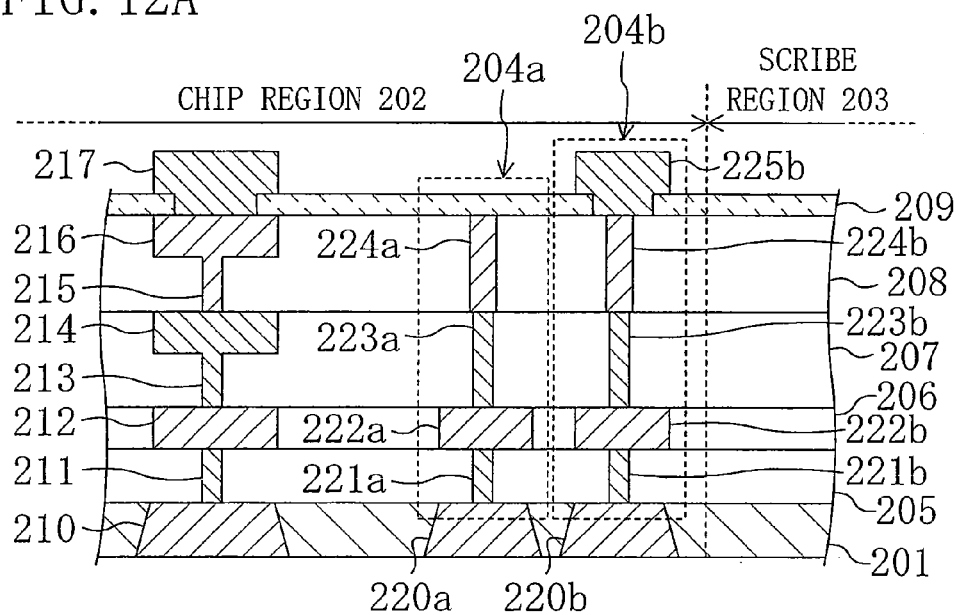
FIG. 12A is a cross-sectional view showing a semiconductor device according to a first modified example of the second embodiment.

FIG. 12A is a cross-sectional view (a view showing the cross-sectional structure taken along the line B-B' in FIG. 7) of a semiconductor device according to this modified example.

The seal ring structure of this modified example shown in FIG. 12A is different from that of the second embodiment shown in FIG. 8A in that the cap layer (first cap layer) 225a is not provided at the top of the inner seal ring (first seal ring) 204a. In other words, the passivation film 209 has no opening on the first seal ring 204a.

Specifically, as shown in FIG. 12A, the semiconductor device of this modified example has a double seal ring structure as in the second embodiment. An outer second seal ring 204b in this structure includes a cap layer (second cap layer) 225b at its top as in the seal ring structure of the first embodiment shown in FIG. 2A, whereas an inner first seal ring 204a does not include a cap layer at its top.

As in the seal ring structure of the second embodiment shown in FIG. 8A, the first and second seal rings 204a and 204b of this modified example are formed in a multilayer structure made of a plurality of interlayer dielectric films 205 through 209. More specifically, first seal vias 221a and 221b are formed on respective conductive layers 220a and 220b provided in a substrate 201, and first seal interconnects 222a and 222b are formed on the respective first seal vias 221a and 221b. Second seal vias 223a and 223b are formed on the respective first seal interconnects 222a and 222b, and third seal vias 224a and 224b are formed on the respective second seal vias 223a and 223b. A passivation film 209 is formed on the third seal via 224a and has an opening on the third seal via 224b, which is located at the top of the outer second seal ring 204b. A cap layer 225b connected to the third seal via 224b is formed in the opening.

In this modified example, the two seal rings 204a and 204b are formed to completely surround the chip region 202. Accordingly, when the semiconductor wafer (substrate) 201 is diced along a scribe region 203 to obtain individual completed semiconductor chips (semiconductor devices), prevention of propagation, to the chip region 202, of mechanical impact or stress caused by contact of a dicing blade with the scribe line (scribe region) 203 during dicing or prevention of damage to the chip region 202 due to the propagation is further ensured.

In this modified example, the cap layer 225b is formed at the top of the outer second seal ring 204b and penetrates the passivation film 209. Accordingly, part of the passivation film 209 in the chip region 202 and part of the passivation film 209 in the scribe region 203 are completely separated from each other by the cap layer 225b to be discontinuous. As a result, it is possible to prevent impact on the scribe region 203 during dicing from propagating to the chip region 202.

Modified Example 2 of Embodiment 2

Hereinafter, a semiconductor device and a method for fabricating the device according to a second modified example of the second embodiment will be described with reference to drawings.

Figure 12B:
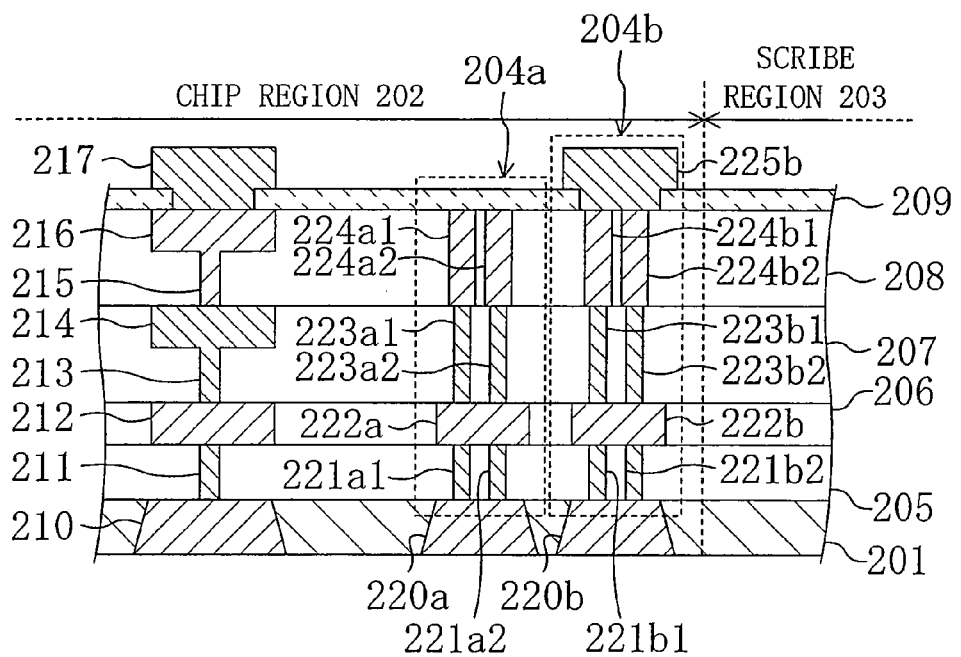
FIG. 12B is a cross-sectional view showing a semiconductor device according to a second modified example of the second embodiment.

FIG. 12B is a cross-sectional view (a view showing the cross-sectional structure taken along the line B-B' in FIG. 7) of a semiconductor device according to this modified example.

The seal ring structure of this modified example shown in FIG. 12B is different from that of the second embodiment shown in FIG. 8B in that the cap layer (first cap layer) 225a is not provided at the top of the inner seal ring (first seal ring) 204a. In other words, the passivation film 209 has no opening on the first seal ring 204a. Specifically, the semiconductor device of this modified example has a double seal ring structure as in the second embodiment. An outer second seal ring 204b in the structure of this modified example includes a cap layer (second cap layer) 225b at its top as in the seal ring structure of the first embodiment shown in FIG. 3A, whereas an inner first seal ring 204a does not include a cap layer at its top.

The seal ring structure of this modified example shown in FIG. 12B is different from that of the first modified example of the second embodiment shown in FIG. 12A in that each seal via constituting the seal rings 204a and 204b has branches.

Specifically, each of first seal vias 221a and 221b in the first interlayer dielectric film 205 is divided into two branches, i.e., first seal vias 221a1 and 221a2 or first seal vias 221b1 and 221b2, respectively. Likewise, each of second seal vias 223a and 223b in the third interlayer dielectric film 207 is divided into two branches, i.e., second seal vias 223a1 and 223a2 or second seal vias 223b1 and 223b2, respectively. Each of third seal vias 224a and 224b in the fourth interlayer dielectric film 208 is divided into two branches, i.e., third seal vias 224a1 and 224a2 or third seal vias 224b1 and 224b2, respectively. A passivation film 209 is formed over the third seal vias 224a1 and 224a2 whereas the passivation film 209 has an opening on the third seal vias 224b1 and 224b2, which are located at the top of the outer second seal ring 204b. A cap layer 225b connected to the third seal vias 224b1 and 224b2 is formed in the opening.

In addition to the advantages obtained in the first modified example of the second embodiment shown in FIG. 12A, the following advantage is obtained in this modified example. That is, since seal vias constituting the seal rings 204a and 204b have branches, the strength of the seal rings 204a and 204b is enhanced and the seal rings 204a and 204b prevent an impurity or moisture from entering the chip region 202 from the outside.

Modified Example 3 of Embodiment 2

Hereinafter, a semiconductor device and a method for fabricating the device according to a third modified example of the second embodiment will be described with reference to drawings.

Figure 13:
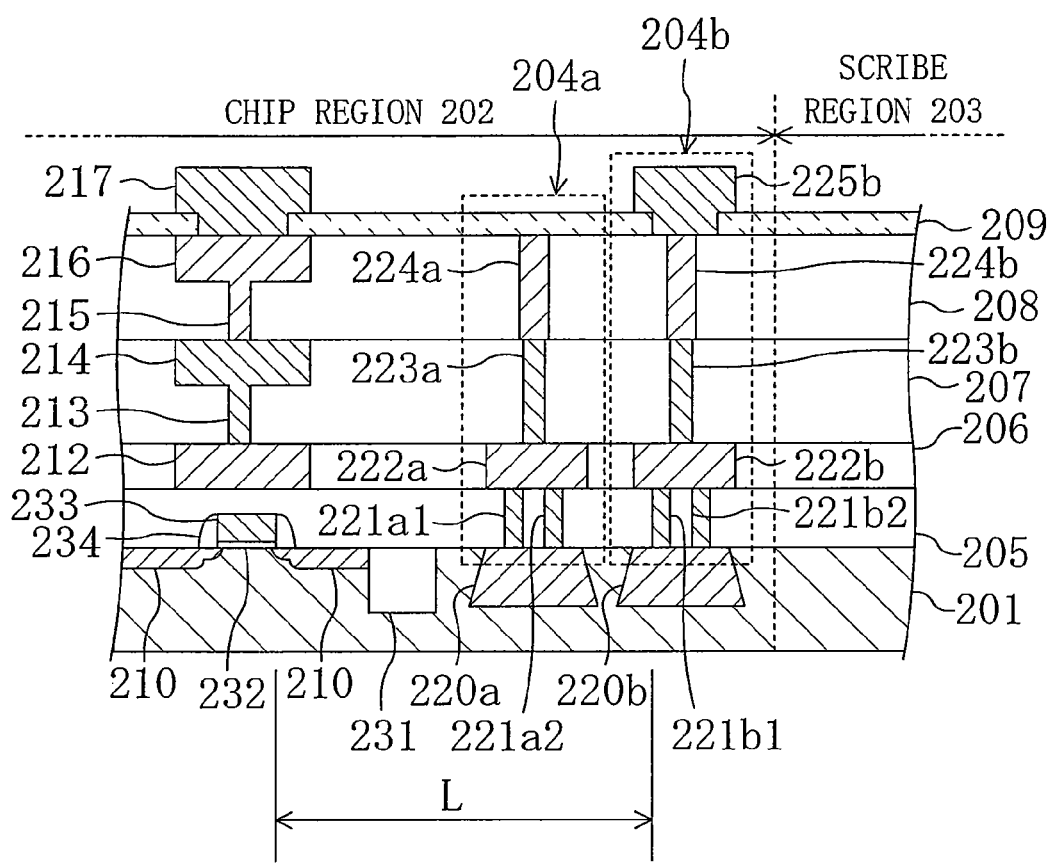
FIG. 13 is a cross-sectional view showing a semiconductor device according to a third modified example of the second embodiment.

FIG. 13 is a cross-sectional view (a view showing the cross-sectional structure taken along the line B-B' in FIG. 7) of a semiconductor device according to this modified example.

The semiconductor device of this modified example shown in FIG. 13 is different from that of the second embodiment shown in FIG. 8B in that a transistor is provided in part of the substrate 201 in the chip region 202 near the seal rings 204a and 204b. Specifically, a gate electrode 233 is formed over an area of the substrate 201 surrounded by an isolation 231 with a gate insulating film 232 interposed therebetween. An insulating sidewall 234 is formed on side faces of the gate electrode 233. An active layer 210 to be source/drain regions is defined in parts of the substrate 201 below the sides of the gate electrode 233.

The seal ring structure of this modified example shown in FIG. 13 is different from that of the second embodiment shown in FIG. 5B in that each of the first seal vias 221a and 221b in the first interlayer dielectric film 205 in which the transistor is formed is divided into two first seal vias 221a1 and 221a2 or two first seal vias 221b1 an 221b2, respectively. As in the seal ring structure of the first modified example of the second embodiment shown in FIG. 12A, the cap layer (first cap layer) 225a is not provided on an inner seal ring (first seal ring) 204a. In other words, a passivation film 209 does not have an opening on the first seal ring 204a.

With recent reduction in chip size, the distance from a portion of a wafer at which the wafer is diced (i.e., a scribe region) to the transistor closest to this portion (hereinafter, referred to as a nearest transistor) has decreased. Specifically, in a conventional device in which no element is provided under a pad, the distance from a seal ring to the nearest transistor (corresponding to distance L in FIG. 13) is approximately 100 μm. On the other hand, such a layout that an element is provided under a pad has been employed in recent years, and the distance L from a seal ring to the nearest transistor has been reduced to approximately 10 μm accordingly. As a result, impact during dicing easily propagates to the transistor so that the transistor is readily damaged. On the other hand, since the transistor has a miniaturized structure including a thin gate oxide film and others, the transistor is vulnerable to impact. Therefore, transistors need to have protection especially against damage during dicing.

In view of this, in this modified example, the "seal via structure having two or more branches" described above is employed to enhance the strength of the seal ring structure of a transistor layer. Specifically, each of the first seal vias 221a and 221b constituting the seal rings 204a and 204b is divided into two branches in the dielectric film as the bottom layer on the substrate 201, i.e., the first interlayer dielectric film 205 as a transistor layer including the gate electrode 233 and others, so that each of the branches, i.e., the seal vias 221a1, 221a2, 221b1 and 221b2, serves as a barrier against impact on the bottom layer in the chip region 202. In this manner, damage to a transistor during dicing is prevented, thus enhancing the yield in manufacturing semiconductor devices.

In this modified example, the "seal via structure having two or more branches" is used in a layer in which a miniaturized transistor is provided. Alternatively, the "seal via structure having two or more branches" may be used in a miniaturized layer or a layer having a miniaturized structure.

Embodiment 3

Hereinafter, a semiconductor device and a method for fabricating the device according to a third embodiment of the present invention will be described with reference to drawings. In this embodiment, variations of the first and second embodiments will be described.

Figure 14A:
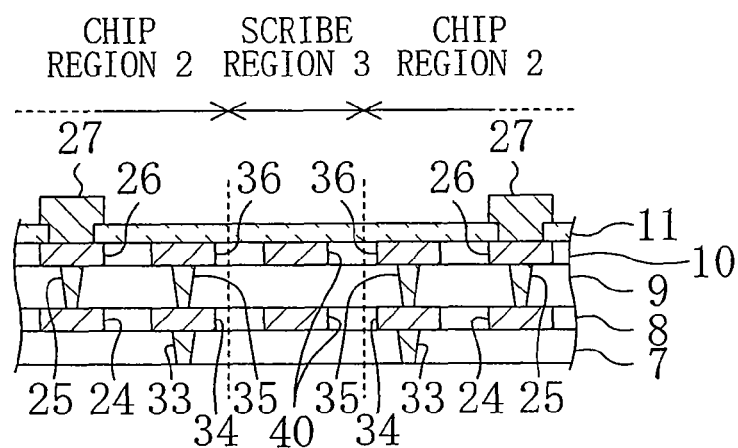
FIG. 14A is a view schematically showing a cross-sectional structure of a conventional semiconductor device shown in FIG. 19.
Figure 19:
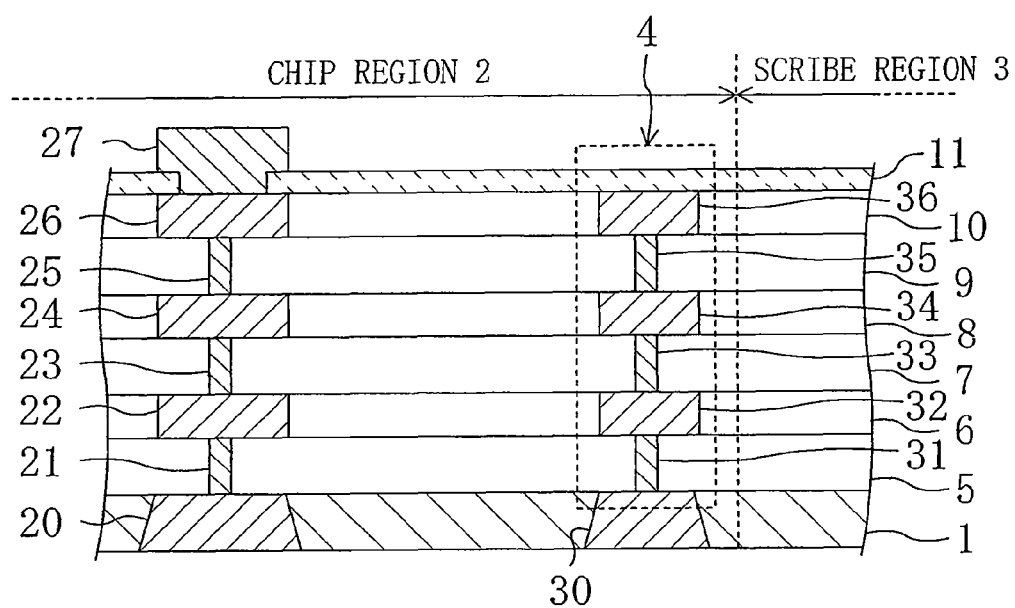
FIG. 19 is a cross-sectional view showing the conventional semiconductor device.

FIG. 14A is a view schematically showing a cross-sectional structure of the conventional semiconductor device shown in FIG. 19. FIG. 14A shows peripheral parts of two chip regions 2 sandwiching the scribe region 3. In FIG. 14A, some components are not shown and components also shown in FIG. 19 are denoted by the same reference numerals, and the description thereof will be omitted. As shown in FIG. 14A, accessory interconnects 40 are provided in the interlayer dielectric films 8 and 10 in the scribe region 3.

Figure 14B:
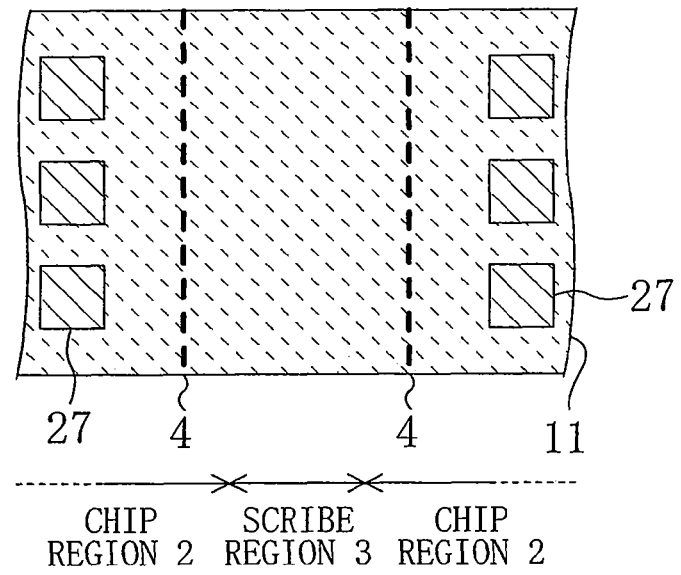
FIG. 14B is a plan view corresponding to the structure shown in FIG. 14A.

FIG. 14B is a plan view corresponding to the structure shown in FIG. 14A. In FIG. 14B, seal rings 4 under the passivation film 11 are schematically represented by bold broken lines. As shown in FIG. 14B, in the conventional semiconductor device, the seal rings 4 are provided in the shape of lines along the scribe region 3.

Figure 15A:
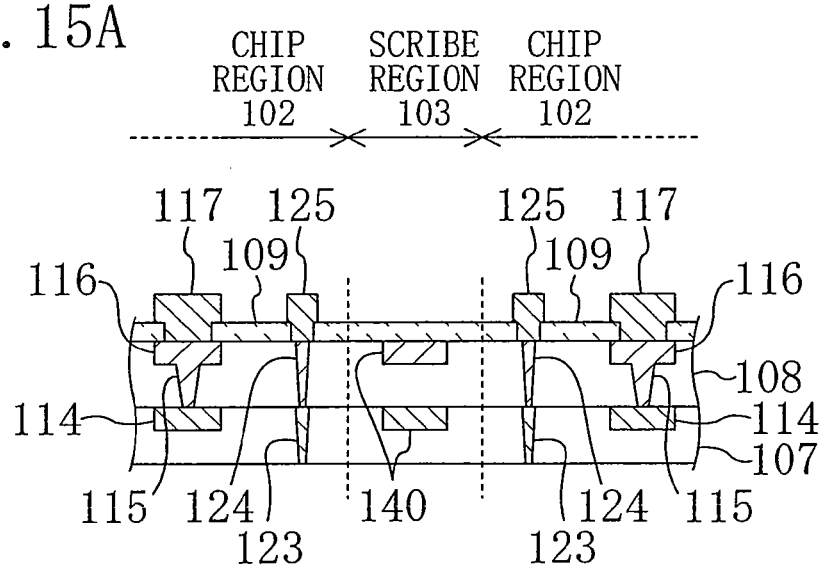
FIG. 15A is a view schematically showing a cross-sectional structure of the semiconductor device of the first embodiment shown in FIG. 2A.

FIG. 15A is a view schematically showing a cross-sectional structure of the semiconductor device of the first embodiment shown in FIG. 2A. FIG. 15A shows peripheral parts of two chip regions 102 sandwiching the scribe region 103. In FIG. 15A, some components are not shown and components also shown in FIG. 2A are denoted by the same reference numerals, and the description thereof will be omitted. As shown in FIG. 15A, accessory interconnects 140 are provided in the interlayer dielectric films 107 and 108 in the scribe region 103.

Figure 15B:
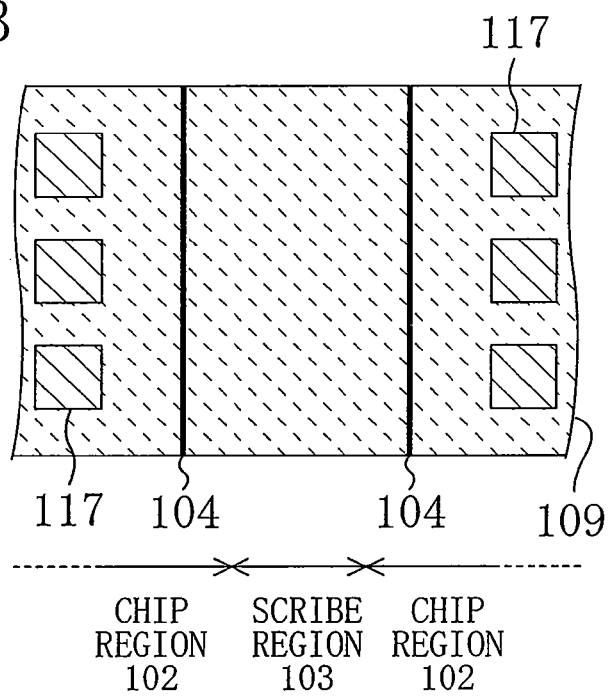
FIG. 15B is a plan view corresponding to the structure shown in FIG. 15A.

FIG. 15B is a plan view corresponding to the structure shown in FIG. 15A. In FIG. 15B, the seal rings 104 including the cap layers 125 at their tops are schematically represented by bold solid lines. As shown in FIG. 15B, in the semiconductor device of the first embodiment, the seal rings 104 are provided in the shape of lines along the scribe region 103.

Figure 16A:
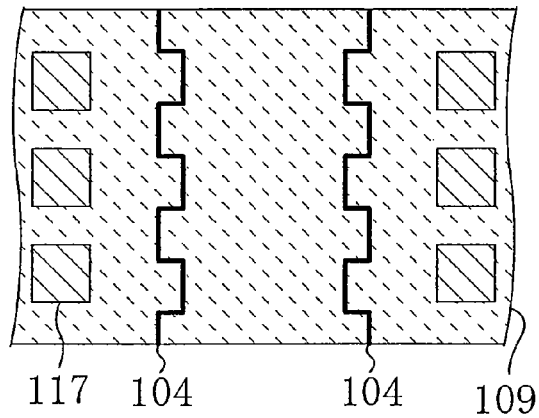
FIGS. 16A through 16C are plan views respectively showing variations of a semiconductor device according to a third embodiment of the present invention.
Figure 16B:
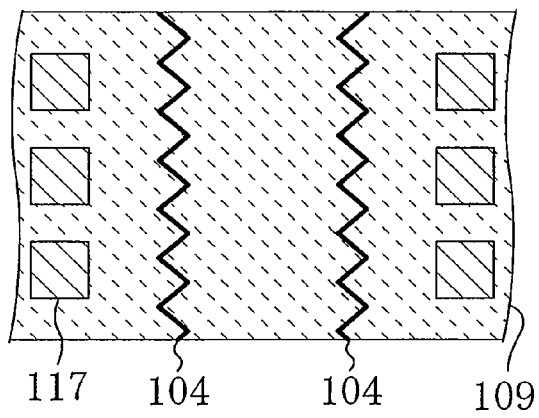
Figure 16C:
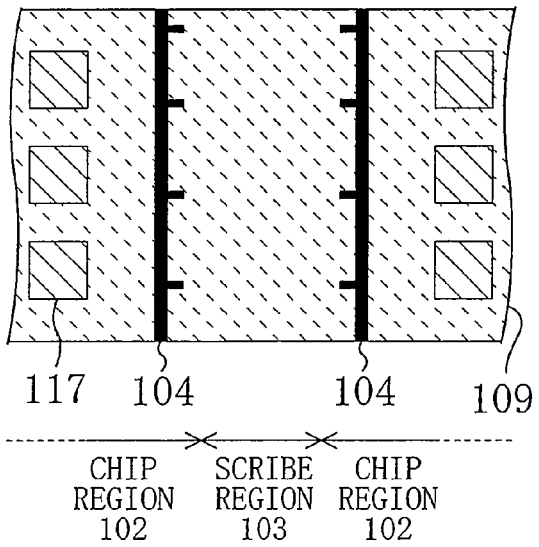

FIGS. 16A through 16C show planar structures of variations of the semiconductor device of the third embodiment, in comparison with the planar structure of the conventional semiconductor device shown in FIG. 14B and the planar structure of the semiconductor device of the first embodiment shown in FIG. 15B. In FIGS. 16A through 16C, the seal rings 104 are also schematically represented by bold solid lines.

The planar structure shown in FIG. 16A is characterized in that each of the seal rings 104 is in the shape of a rectangular wave when viewed from above the substrate 101 (i.e., the passivation film 109).

The planar structure shown in FIG. 16B is characterized in that each of the seal rings 104 is in the shape of a triangular wave when viewed from above the substrate 101.

The planar structure shown in FIG. 16C is characterized in that a plurality of projections extend toward the scribe region 103 from a side of each of the seal rings 104. Specifically, each of the seal rings 104 has a plurality of projections extending vertically to the direction in which the scribe region 103 runs.

The cross-sectional structures of the semiconductor devices associated with the respective structures shown in FIGS. 16A through 16C are similar to that of the first embodiment shown in FIG. 15A or 2A except that the position of the seal rings 104 shifts horizontally or the width of the seal rings 104 changes depending on the position at which the cross-sectional structure is observed.

Methods for fabricating the respective semiconductor devices associated with FIGS. 16A through 16C are similar to that of the first embodiment (shown in FIGS. 4A through 4D, 5A through 5C and 6A through 6C) except that mask patterns for forming seal rings differ among FIGS. 16A through 16C.

In the semiconductor device having a seal ring structure of this embodiment shown in any one of FIGS. 16A through 16C, the seal rings 104 serving as barriers for protecting the chip regions 102 are provided not only in the direction parallel to the direction in which the scribe region 103 runs but also in a direction vertical or diagonal to that direction. Accordingly, it is possible to prevent impact and stress caused by contact of a dicing blade with a film such as the passivation film 109 during dicing and cracks and the like occurring in the wafer (substrate 101) by the impact and stress, from propagating along the sides (the sides facing the scribe region 103) of the seal rings 104.

Figure 17A:
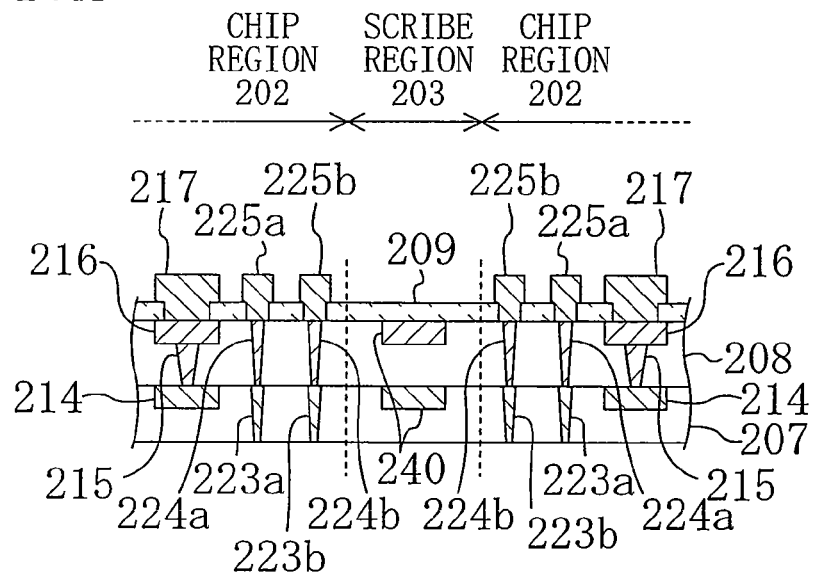
FIG. 17A is a view schematically showing a cross-sectional structure of the semiconductor device of the second embodiment shown in FIG. 8A.

FIG. 17A is a view schematically showing a cross-sectional structure of the semiconductor device of the second embodiment shown in FIG. 8A. FIG. 17A shows peripheral parts of two chip regions 202 sandwiching the scribe region 203. In FIG. 17A, some components are not shown and components also shown in FIG. 8A are denoted by the same reference numerals, and the description thereof will be omitted. As shown in FIG. 17A, accessory interconnects 240 are provided in the interlayer dielectric films 207 and 208 in the scribe region 203.

Figure 17B:
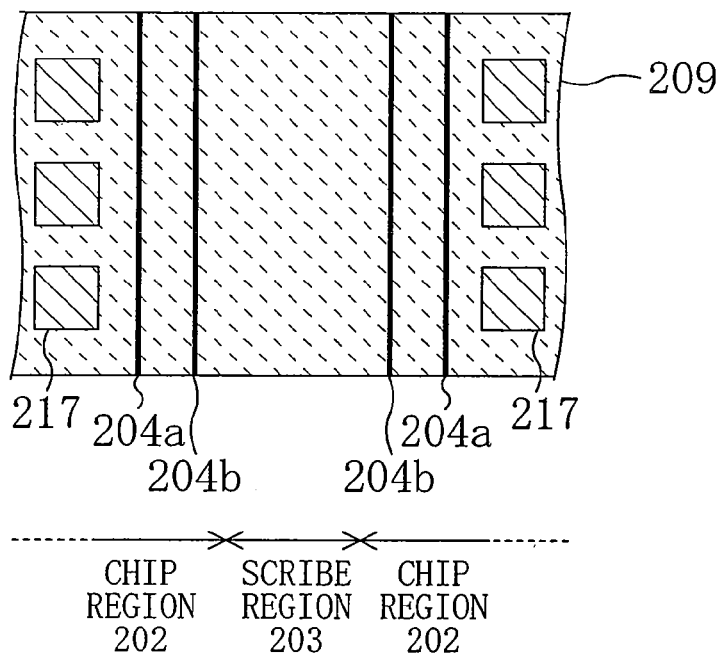
FIG. 17B is a plan view corresponding to the structure shown in FIG. 17A.

FIG. 17B is a plan view corresponding to the structure shown in FIG. 17A. In FIG. 17B, the seal rings 204a and 204b including the cap layers 225a and 225b at their tops are schematically represented by bold solid lines. As shown in FIG. 17B, in the semiconductor device of the second embodiment, the seal rings 204a and 204b are provided in the shape of two lines along the scribe region 203.

Figure 18A:
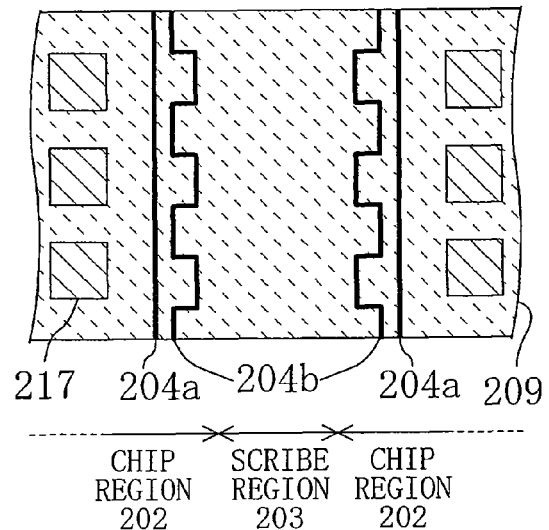
FIGS. 18A through 18C are plan views respectively showing variations of the semiconductor device of the third embodiment.
Figure 18B:
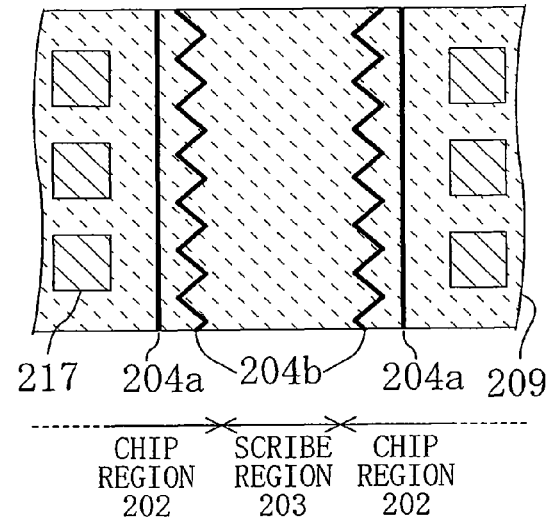
Figure 18C:
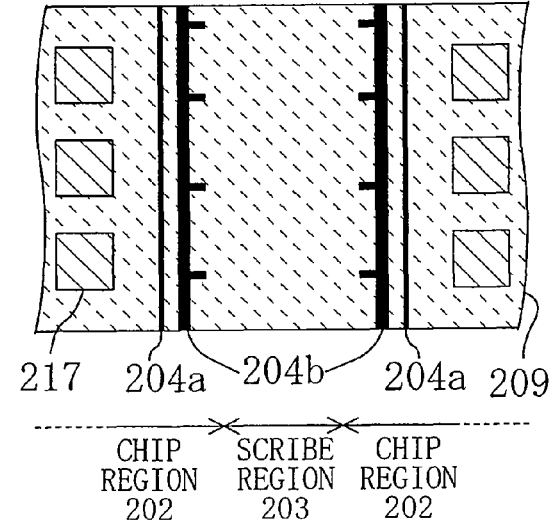

FIGS. 18A through 18C show planar structures of variations of the semiconductor device of this embodiment, in comparison with the planar structure of the semiconductor device of the second embodiment shown in FIG. 17B. In FIGS. 18A through 18C, the seal rings 204a and 204b are also schematically represented by bold solid lines.

The planar structure shown in FIG. 18A is characterized in that each of the seal rings 204b near the scribe region 203 is in shape of a rectangular wave when viewed from above the substrate 201 (i.e., the passivation film 209).

The planar structure shown in FIG. 18B is characterized in that each of the seal rings 204b near the scribe region 203 is in the shape of a triangular wave when viewed from above the substrate 201.

The planar structure shown in FIG. 18C is characterized in that a plurality of projections extend toward the scribe region 203 from a side of each of the seal rings 204b near the scribe region 203. Specifically, each of the seal rings 204b has a plurality of projections extending vertically to the direction in which the scribe region 203 runs.

The cross-sectional structures of the semiconductor devices associated with the respective structures shown in FIGS. 18A through 18C are similar to that of the second embodiment shown in FIG. 17A or 8A except that the position of the seal rings 204b shifts horizontally or the width of the seal rings 204b changes depending on the position at which the cross-sectional structure is observed.

Methods for fabricating the respective semiconductor devices associated with FIGS. 18A through 18C are similar to that of the second embodiment (shown in FIGS. 9A through 9D and 10A through 10C) except that mask patterns for forming seal rings differ among FIGS. 18A through 18C.

In the semiconductor device with a seal ring structure of this embodiment shown in any one of FIGS. 18A through 18C, the following advantage is obtained in addition to the advantages of the second embodiment obtained by the double seal ring structure. That is, the seal rings 204b near the scribe region 203 out of the seal rings 204a and 204b serving as barriers for protecting the chip regions 202 are provided not only in the direction parallel to the direction in which the scribe region 203 runs but also in a direction vertical or diagonal to that direction. Accordingly, it is possible to prevent impact and stress caused by contact of a dicing blade with a film such as the passivation film 209 during dicing and cracks and the like occurring in the wafer (substrate 201) by the impact and stress, from propagating along the sides (the sides facing the scribe region 203) of the respective seal rings 204b.

In the seal ring structures (double structures) of this embodiment shown in FIGS. 18A through 18C, the seal rings 204a in the shape of lines in a plan view and the seal rings 204b in a shape other than the line shape in the plan view are combined. Alternatively, the seal rings 204a and 204b may be in the same shape or in different shapes other than the line shape in a plan view. Alternatively, a seal ring structure which includes three or more seal rings and in which at least the outermost seal ring is in a shape other than the line shape in a plan view may be used. However, if the seal ring structure includes seal rings in a shape/shapes other than the line shape in a plan view or includes three or more seal rings, the widths of the seal rings occupy a large part of the width of a semiconductor device (i.e., semiconductor chip), so that this structure might be disadvantageous in miniaturization of semiconductor devices. Therefore, it is preferable to use a double seal ring structure in which a seal ring in the shape of a line in a plan view and a seal ring in a shape other than the line shape in the plan view are combined, as the seal ring structures of this embodiment shown in FIGS. 18A through 18C, respectively.

As described above, in the foregoing embodiments of the present invention, a seal via constituting a seal ring and a dual damascene interconnect structure in a chip region are formed through an interlayer dielectric film by the same process and the seal via is continuous in the film. Therefore, the seal via penetrates the interlayer dielectric film without a "junction". Accordingly, the number of "junctions" is reduced in the entire seal ring structure. This further prevents an impurity or the like from entering through "junctions", as compared to a seal ring structure including a large number of "junctions". As a result, the strength of the seal ring structure is enhanced. That is, it is possible to prevent impact from propagating into a chip region during dicing. In addition, it is also possible to prevent an impurity or the like from entering the chip region from the outside.

In the foregoing embodiments of the present invention, the structure in which a cap layer is provided at the top of a seal ring, the structure in which a seal via constituting a seal ring is divided into branches, the structure in which a seal via is formed simultaneously with formation of a dual damascene structure in a chip region, and the structure in which a plurality of seal rings surround a chip region, are used. These structures further ensure prevention of damage to a chip region or prevention of damage to part of the chip region when a wafer is diced into chips along a scribe region. Accordingly, it is possible to prevent impact on the scribe region during dicing from propagating into the chip region, so that an IC, interconnect layers and others in the chip region are not damaged. As a result, the yield in manufacturing semiconductor devices (chips) is enhanced and high-precision chips are obtained.

In the foregoing embodiments of the present invention, a seal ring structure is provided in a peripheral part of a chip region (part of the chip region near the boundary between the chip region and the scribed region.) Alternatively, the seal ring structure may be provided in part of the scribed region (part of the scribe region near the boundary between the scribed region and the chip region) which will remain as an end portion of a semiconductor device (semiconductor chip) after dicing.

What is claimed is:

1. A semiconductor device comprising:
an element formed on a substrate in a chip region;
a multilayer structure including a plurality of dielectric films formed on the substrate;
a seal ring structure formed through the multilayer structure in a peripheral part of the chip region and surrounding the chip region; and
an insulating film formed on the multilayer structure in which the seal ring structure is provided, wherein
the insulating film has an opening on a top of the seal ring structure,
a cap layer is formed in the opening to be connected to the seal ring structure,
the plurality of dielectric films includes a First dielectric film and a second dielectric film,
the seal ring structure includes one or more first seal vias in the first dielectric film and one or more second seal vias in the second dielectric film,
the first dielectric film is formed between the substrate and the second dielectric film,
a number of first seal vias is greater than a number of second seal vias,
the second seal vias have a length that is greater than a length of the first seal vias,
the seal ring structure includes a first seal ring surrounding the chip region and a second seal ring surrounding the first seal ring,
the insulating film has a first opening on a top of the first seal ring and a second opening on a top of the second seal ring,
the cap layer includes a first cap layer and a second cap layer,
the first cap layer is formed in the first opening to be connected to the first seal ring, and
the second cap layer is formed in the second opening to be connected to the second seal ring.

2. The device of claim 1, further comprising:
an interconnect formed in at least one of the dielectric films in the chip region; and
a plug formed in at least one of the dielectric films in the chip region and connecting either the element and the interconnect or the interconnect and another interconnect.

3. The device of claim 2, wherein
a dual damascene interconnect in which the interconnect and the plug connected to the interconnect are integrated is formed in at least one of the dielectric films in the chip region, and
a part of the seal ring structure located in the dielectric film in which the dual damascene interconnect is formed is continuous.

4. The device of claim 1, wherein
at least part of the seal ring structure is buried in a recess portion formed in one of the dielectric films or in at least two successive dielectric films out of the plurality of dielectric films, and
the recess portion has an aspect ratio of three or more.

5. The device of claim 1, wherein the seal ring structure includes at least one material selected from the group consisting of W, Al and Cu.

6. The device of claim 1, wherein the cap layer includes Al.

7. The device of claim 1, wherein
the first dielectric film is thinner than the second dielectric film.

8. The device of claim 1, wherein
the first dielectric film is in direct contact with the substrate.

9. The device of claim 1, wherein:
the cap layer includes Al, and
the seal ring structure includes Cu.

* * * * *